US010358601B2

(12) United States Patent
Bae et al.

(10) Patent No.: US 10,358,601 B2
(45) Date of Patent: Jul. 23, 2019

(54) LIQUID-CRYSTAL MEDIA AND LIGHT MODULATION ELEMENT

(71) Applicant: Merck Patent GmbH, Darmstadt (DE)

(72) Inventors: Hyun-Woo Bae, Seoul (KR); Dong-Mee Song, Hwaseong (KR); Hoo-Yong Lee, Pyeongtaek (KR); Jung-Min Lee, Seoul (KR); Yong-Kuk Yun, Gyeonggi-do (KR)

(73) Assignee: Merck Patent GmbH, Darmstadt (DE)

(*) Notice: Subject to any disclaimer, the term of this patent is extended or adjusted under 35 U.S.C. 154(b) by 10 days.

(21) Appl. No.: 15/446,389

(22) Filed: Mar. 1, 2017

(65) Prior Publication Data

US 2017/0253801 A1 Sep. 7, 2017

(30) Foreign Application Priority Data

Mar. 1, 2016 (EP) .................................... 16158122

(51) Int. Cl.

| | |
|---|---|
| ***G02F 1/1333*** | (2006.01) |
| ***C09K 19/44*** | (2006.01) |
| ***C09K 19/30*** | (2006.01) |
| ***C09K 19/38*** | (2006.01) |
| ***C09K 19/60*** | (2006.01) |
| ***G02F 1/1341*** | (2006.01) |
| ***H01L 27/32*** | (2006.01) |
| ***C09K 19/04*** | (2006.01) |

(52) U.S. Cl.

CPC .............. *C09K 19/44* (2013.01); *C09K 19/04* (2013.01); *C09K 19/3003* (2013.01); *C09K 19/3814* (2013.01); *C09K 19/60* (2013.01); *G02F 1/1341* (2013.01); *G02F 1/133365* (2013.01); *H01L 27/3232* (2013.01); *C09K 2019/0448* (2013.01); *C09K 2019/0466* (2013.01); *C09K 2019/301* (2013.01); *C09K 2019/3009* (2013.01); *C09K 2019/3016* (2013.01); *H01L 2251/5323* (2013.01)

(58) Field of Classification Search

CPC ................ C09K 19/44; C09K 19/3003; C09K 19/3814; C09K 19/60; C09K 19/04; C09K 2019/0466; C09K 2019/3009; C09K 2019/301; C09K 2019/3016; C09K 2019/0448; G02F 1/1333; G02F 1/1341; G02F 1/133365; H01L 27/3232; H01L 2251/5323

USPC ..................................................... 252/299.01

See application file for complete search history.

(56) References Cited

U.S. PATENT DOCUMENTS

| | | | | |
|---|---|---|---|---|
| 8,895,117 | B2 | 11/2014 | Jansen et al. | |
| 9,315,729 | B2 | 4/2016 | Wittek et al. | |
| 9,347,000 | B2 | 5/2016 | Jansen et al. | |
| 9,822,305 | B2 * | 11/2017 | Wittek ............... | C09K 19/0275 |
| 2011/0261311 | A1 | 10/2011 | Jansen et al. | |
| 2014/0097384 | A1 * | 4/2014 | Wittek ............... | C09K 19/0275 252/299.66 |
| 2014/0125938 | A1 | 5/2014 | Wittek et al. | |
| 2014/0362334 | A1 | 12/2014 | Jansen et al. | |

FOREIGN PATENT DOCUMENTS

| | | | |
|---|---|---|---|
| DE | 102012009631 | A1 | 11/2012 |
| EP | 2380945 | A1 | 10/2011 |

OTHER PUBLICATIONS

European Search Report dated Jul. 12, 2017 issued in corresponding EP 17158030 application (2 pages).

J. Heo et al., "Fast-Switching Initially-Transparent Liquid Crystal Light Shutter With Crossed Patterned Electrodes", AIP Advances, vol. 5 (2015) pp. 047118.

Ji-Hoon Lee; Enhanced contrast ratio and viewing angle of polymer-stabilized liquid crystal via refractive index matching between liquid crystal and polymer network; Optics Express vol. 21, Issue 22, pp. 26914-26920 (2013).

* cited by examiner

*Primary Examiner* — Geraldina Visconti

(74) *Attorney, Agent, or Firm* — Millen White Zelano & Branigan, PC

(57) ABSTRACT

The present invention relates to liquid crystalline (LC) medium, to a method of its production and to the use of such LC media in polymer network liquid crystalline (PNLC) light modulation elements operated in the reverse mode. Furthermore, the present invention relates to such light modulation elements, as such, to the use of such light modulation elements as light shutters for transparent OLED displays, and to a method of production of such light modulation elements according to the present invention.

24 Claims, No Drawings

LIQUID-CRYSTAL MEDIA AND LIGHT MODULATION ELEMENT

TECHNICAL FIELD

The present invention relates to liquid crystalline (LC) media, to a method of production thereof, and to the use of such LC media in polymer network liquid crystalline (PNLC) light modulation elements operated in the reverse mode. Furthermore, the present invention relates to such light modulation elements, as such, to the use of such light modulation elements as light shutters for transparent OLED displays, and to a method of production of such light modulation elements according to the present invention.

STATE OF THE ART

See-through displays or transparent displays have received increasing attention as next-generation displays, as described, for example, by C.-H. Lin, W.-B. Lo, K.-H. Liu, C.-Y. Liu, J.-K. Lu, and N. Sugiura, "Novel transparent LCD with tuneable transparency," SID Dig. Tech. Pap. 43, 1159-1162 (2012), and B.-J. Mun, W. S. Kang, J. H. Lee, H. C. Choi, B. K. Kim, B. Kang, Y. J. Lim, S. H. Lee, and G.-D Lee, "A high transmittance color liquid crystal display mode with controllable color gamut and transparency," Opt. Express 22, 12505-12512 (2013).

Most of current researches are focused on see-through displays using organic light emitting diodes (OLEDs), as, for example, described by C. W. Tang and S. A. Van Slyke, "Organic electroluminescent diodes," Appl. Phys. Lett. 51, 913-915 (1987) and G. Gu, V. Bulović, P. E. Burrows, S. R. Forrest, and M. E. Thompson, "Transparent organic light emitting devices," Appl. Phys. Lett. 68, 2606-2608 (1996).

A pixel in a see-through OLED display is divided into transparent and light-emitting parts. One can see the background image through the transparent part. However, it is not possible to obtain black color in a see-through OLED display because the transparent part is continuously open to the background. As a result, see-through OLED display panels exhibit poor visibility. This inevitable problem can be solved by placing a light shutter at the back of a see-through display.

Several types of light shutters using liquid crystals (LCs), such as polymer-dispersed LC, LC gel, cholesteric LC (ChLC), and dye-doped LC, have been proposed, for example, by J. W. Doane, N. A. Vaz, B. G. Wu, and S. Zůmer, "Field controlled light scattering from nematic micro droplets," App. Phys. Lett. 48, 269-271 (1986), R. A. M. Hikmet, "Electrically induced light scattering from anisotropic gels," J. Appl. Phys. 68, 4406-4412 (1990), D.-K. Yang, J. L. West, L.-C. Chien, and J. W. Doane, "Control of reflectivity and bistability in displays using cholesteric liquid crystals," J. Appl. Phys. 76, 1331-1333 (1994), H. Ren, Y.-H. Lin, Y.-H. Fan, and S.-T. Wu, "In-plane switching liquid crystal gel for polarization-independent light switch," J. Appl. Phys. 96, 3609-3611 (2004), G. D. Love, A. K. Kirby, and R. A. Ramsey, "Sub-millisecond, high stroke phase modulation using polymer network liquid crystals," Opt. Express 18, 7384-7389 (2010), G. H. Lee, K. Y. Hwang, J. E. Jang, Y. W. Jin, S. Y. Lee, and J. E. Jung, "Characteristics of color optical shutter with dye-doped polymer network liquid crystal," Opt. Lett. 36, 754-756 (2011), J. Sun, R. A. Ramsey, Y. Chen, and S.-T Wu, "Submillisecond-response sheared polymer network liquid crystals for display applications," J. Disp. Technol. 8, 87-90 (2012), and B.-H. Yu, J.-W. Huh, K.-H. Kim, and T.-H. Yoon, "Light shutter using dichroic-dye-doped long-pitch cholesteric liquid crystals," Opt. Express 21, 29332-29337 (2013).

These light shutters are switchable between their transparent and translucent (or opaque) states by scattering (or absorbing) the incident light. The translucent or opaque state can be used to increase the visibility of a see-through display, whereas the transparent state can be used to view the background together with the displayed images. These light shutters, however, suffer from a slow response times because of their reliance on the slow relaxation of the LCs. Moreover, the light shutters require high operating voltages because of their helical structure or utilized polymer materials. In addition, power consumption is one of the key issues related to a display device. Because most light shutters are initially in the translucent or opaque state, power must be continuously supplied to a display panel in order to maintain the transparent state while the display panel is not used.

More recently, Yoon et al. suggested in AIP Advances 5, 047118 (2015), an initially transparent light shutter using a polymer-networked LC (PNLC) cell containing patterned electrodes. The authors utilized a LC host mixture having a positive dielectric anisotropy E7 and ($\Delta n$: 0.223, $\Delta\varepsilon$: 13.5, Merck) together with 5 wt % of UV curable monomers (Bisphenol A dimethacrylate, Sigma-Aldrich). These light shutters are produced with a long lasting curing process and costly electrode structures, since they need patterned ITO electrode structures. Moreover, such ITO electrode structures are currently not applicable for plastic substrates.

In summary, the attempts to solve the above mentioned requirements of the prior art are connected with several disadvantages such as, for example, an increase of the operational voltage, an unfavorable translucent or opaque state with a low haze level, an unfavorable transparent state with a high residual haze, a reduction of the switching speed, or unfavorable processing steps, which are especially not compatible with commonly known methods for the mass production of corresponding LC devices.

Thus, one aim of the invention is to provide an alternative or preferably improved light modulation element and a process of preparing such liquid crystal light modulation element operated in the reverse mode, which does not have the drawbacks of the prior art, and preferably have one or more advantages mentioned above and below. Other aims of the present invention are immediately evident to the person skilled in the art from the following detailed description.

Surprisingly, the inventors have found out that one or more of the above and below defined requirements can be achieved by the present invention with a medium having a negative dielectric anisotropy comprising one or more compounds of formula I, defined below.

BRIEF DESCRIPTION

Thus, the invention relates to a liquid-crystalline (LC) medium having a negative dielectric anisotropy comprising one or more compounds of formula I $$P^a\text{-}(Sp^a)_{s1}\text{-}(A^1\text{-}Z^1)_{n1}\text{-}A^2\text{-}Q^1\text{-}A^3\text{-}(Z^4\text{-}A^4)_{n2}\text{-}(Sp^b)_{s2}\text{-}P^b \qquad \text{I}$$

in which the individual radicals have the following meanings:

$P^a$ denotes a polymerizable group, $P^b$ denotes a polymerizable group, H or F, preferably a polymerizable group, $Sp^a$, $Sp^b$ each, independently of one another, denote a spacer group, s1, s2 each, independently of one another, denote 0 or 1, n1, n2 each, independently of one another, denote 0 or 1, preferably 0, $Q^1$ denotes $-CF_2O-$, $-OCF_2-$, $-CH_2O$, $-OCH_2$, $-(CO)O-$, $-O(CO)-$, $-(CH_2)_4-$, $-CH_2CH_2-$, $-CF_2-CF_2-$, $-CF_2-CH_2-$, $-CH_2-CF_2-$, $-CH{=}CH-$, $-CF{=}CF-$, $-CF{=}CH-$, $-(CH_2)_3O-$, $-O(CH_2)_3-$, $-CH{=}CF-$, $-C{\equiv}C-$, $-O-$, $-CH_2-$, $-(CH_2)_3-$, or $-CF_2-$, preferably $-CF_2O-$, $Z^1$, $Z^4$ denote each and independently a single bond, $-CF_2O-$, $-OCF_2-$, $-CH_2O-$, $-OCH_2-$, $-(CO)O-$, $-O(CO)-$, $-(CH_2)_4-$, $-CH_2CH_2-$, $-CF_2-CF_2-$, $-CF_2-CH_2-$, $-CH_2-CF_2-$, $-CH{=}CH-$, $-CF{=}CF-$, $-CF{=}CH-$, $-(CH_2)_3O-$, $-O(CH_2)_3-$, $-CH{=}CF-$, $-C{\equiv}C-$, $-O-$, $-CH_2-$, $-(CH_2)_3-$, or $-CF_2-$, where $Z^1$ and $Q^1$ or $Z^2$ and $Q^1$ do not simultaneously denote a group selected from $-CF_2O-$ and $-OCF_2-$, $A^1$, $A^2$, $A^3$, $A^4$ each, independently of one another, denotes a radical selected from the following groups:

a) the group consisting of 1,4-phenylene and 1,3-phenylene, in which, in addition, one or two CH groups may each be replaced by N and in which, in addition, one or more H atoms may each be replaced by L, b) the group consisting of trans-1,4-cyclohexylene, 1,4-cyclohexenylene and 1,4'-bicyclohexylene, in which, in addition, one or more non-adjacent $CH_2$ groups may each be replaced by —O— and/or —S— and in which, in addition, one or more H atoms may each be replaced by F or Cl, c) the group consisting of tetrahydropyran-2,5-diyl, 1,3-dioxane-2,5-diyl, tetrahydrofuran-2,5-diyl, cyclobutane-1,3-diyl, piperidine-1,4-diyl, thiophene-2,5-diyl and selenophene-2,5-diyl, each of which may, in addition, be mono- or polysubstituted by L, d) the group consisting of saturated, partially unsaturated or fully unsaturated, and optionally substituted, polycyclic radicals having 5 to 20 cyclic C atoms, one or more of which may also be replaced by heteroatoms, preferably selected from the group consisting of bicyclo[1.1.1]-pentane-1,3-diyl, bicyclo[2.2.2]octane-1,4-diyl, spiro[3.3]-heptane-2,6-diyl,

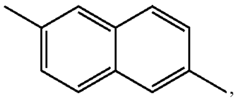,

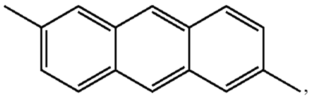,

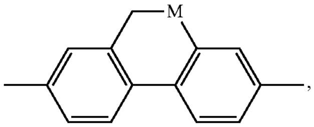,

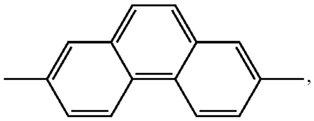,

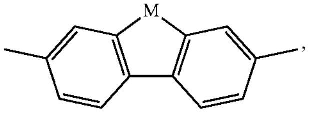,

-continued

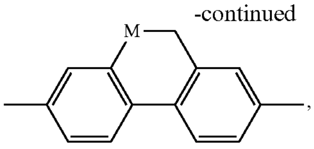,

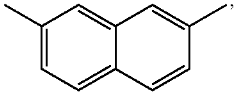,

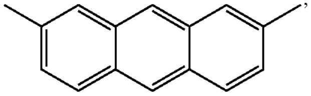,

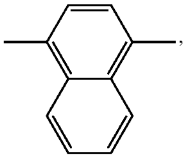,

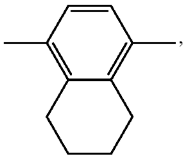,

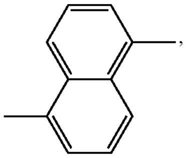,

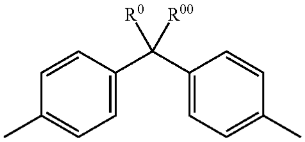

where, in addition, one or more H atoms in these radicals may each be replaced by L, and/or one or more double bonds may each be replaced by single bonds, and/or one or more CH groups may each be replaced by N, L on each occurrence, identically or differently, denotes F, Cl, CN, SCN, $SF_5$ or straight-chain or branched, in each case optionally fluorinated, alkyl, alkoxy, alkylcarbonyl, alkoxycarbonyl, alkylcarbonyloxy or alkoxycarbonyloxy having 1 to 12 C atoms, $R^0$, $R^{00}$ each, independently of one another, denote H, F or straight-chain or branched alkyl having 1 to 12 C atoms, in which, in addition, one or more H atoms may each be replaced by F, M denotes —O—, —S—, $-CH_2-$, $-CHY^1-$ or $-CY^1Y^2-$, and $Y^1$ and $Y^2$ each, independently of one another, have one of the meanings indicated above for $R^0$, or denote Cl or CN, one of the groups $Y^1$ and $Y^2$ may alternatively also denote $-OCF_3$, preferably denote H, F, Cl, CN or $CF_3$, or to a medium having a negative dielectric anisotropy, comprising a polymer obtainable from polymerization of one or more compounds of the formula I, and to the use of such media in light modulation elements operated in the reverse mode.

The invention furthermore relates to a LC medium having a negative anisotropy comprising one or more compounds of the formula I and one or more additional compounds, which may also be mesogenic, liquid-crystalline and/or polymerizable.

The invention furthermore relates to a LC medium having a negative anisotropy comprising a polymer obtainable by polymerization of one or more compounds of the formula I, and optionally comprising one or more additional compounds, which may also be mesogenic, liquid-crystalline and/or polymerizable.

The invention furthermore relates to a LC medium having a negative anisotropy comprising a polymerizable component comprising one or more polymerizable compounds of the formula I, or the polymerized form of this polymerizable component, and a liquid-crystalline component, also referred to below as "LC host mixture", comprising one or more, preferably two or more, low-molecular-weight (i.e. monomeric and unpolymerizable) compounds as described above and below, which are preferably mesogenic or liquid-crystalline.

The invention furthermore relates to a process for the preparation of an LC medium as described above and below in which one or more low-molecular-weight liquid-crystalline compounds, or an LC host mixture (liquid-crystal mixture) as described above and below, are mixed with one or more compounds of the formula I and optionally one or more additives, such as stabilizers, photoinitiators, antioxidants.

The invention furthermore relates to the use of an LC medium as described above and below in a light modulation element.

The invention furthermore relates to a light modulation element comprising a LC cell having two substrates and two electrodes, where at least one substrate is transparent to light and at least one substrate has one or two electrodes, and a layer, located between the substrates, of an LC medium comprising a polymerized component and a low-molecular-weight component, where the polymerized component is obtainable by polymerization of one or more polymerizable compounds between the substrates of the LC cell in the LC medium, preferably with application of an electrical voltage to the electrodes, characterized in that at least one of the polymerizable compounds is selected from formula I.

The invention furthermore relates to a light modulation element as described above and below, in a transparent OLED.

The invention furthermore relates to a process for the production of an light modulation element as described above and below in which an LC medium comprising one or more low-molecular-weight liquid-crystalline compounds or a LC host mixture as described above and below and one or more polymerizable compounds, at least one of which is selected from formula I, is introduced into an LC cell having two substrates and two electrodes as described above and below, and the polymerizable compounds are polymerized.

Especially, by utilizing the LC media according to the present invention in PNLC light modulation elements operated in the reverse mode, the above and below mentioned requirements, amongst others, can be fulfilled, preferably at the same time.

In particular, the light modulation elements exhibit, preferably at the same time, favorable fast response times, favorable low voltages required for addressing, and favorable really dark or hazy "on states".

In addition, the light modulation elements can be produced by compatible, commonly known methods for the mass production.

Terms and Definition

Unless explicitly stated otherwise, the following meanings apply above and below:

The terms "liquid crystal", "mesogen" and "mesogenic compound" as used herein mean a compound that under suitable conditions of temperature, pressure and concentration can exist as a mesophase or in particular as a LC phase.

The term "mesogenic group" is known to the person skilled in the art and is described in the literature, and denotes a group which, due to the anisotropy of its attracting and repelling interactions, essentially contributes to causing a liquid-crystal (LC) phase in low-molecular-weight or polymeric substances. Compounds containing mesogenic groups (mesogenic compounds) do not necessarily have to have an LC phase themselves. It is also possible for mesogenic compounds to exhibit LC phase behavior only after mixing with other compounds and/or after polymerization. Typical mesogenic groups are, for example, rigid rod- or disc-shaped units. An overview of the terms and definitions used in connection with mesogenic or LC compounds is given in Pure Appl. Chem. 73(5), 888 (2001) and C. Tschierske, G. Pelzl, S. Diele, Angew. Chem. 2004, 116, 6340-6368.

The term "hydrocarbyl group" means any monovalent or multivalent organic radical moiety which comprises at least one carbon atom and optionally one or more H atoms, and optionally one or more hetero atoms like for example N, O, S, P, Si, Se, As, Te or Ge. A hydrocarbyl group comprising a chain of 3 or more C atoms may also be linear, branched and/or cyclic, including spiro and/or fused rings.

Throughout the application, the term "aryl and heteroaryl groups" encompass groups, which can be monocyclic or polycyclic, i.e. they can have one ring (such as, for example, phenyl) or two or more rings, which may also be fused (such as, for example, naphthyl) or covalently linked (such as, for example, biphenyl), or contain a combination of fused and linked rings. Heteroaryl groups contain one or more heteroatoms, preferably selected from O, N, S and Se. Particular preference is given to mono-, bi- or tricyclic aryl groups having 6 to 25 C atoms and mono-, bi- or tricyclic heteroaryl groups having 2 to 25 C atoms, which optionally contain fused rings, and which are optionally substituted. Preference is furthermore given to 5, 6 or 7-membered aryl and heteroaryl groups, in which, in addition, one or more CH groups may each be replaced by N, S or O in such a way that O atoms and/or S atoms are not linked directly to one another. Preferred aryl groups are, for example, phenyl, biphenyl, terphenyl, [1,1':3',1"]terphenyl-2'-yl, naphthyl, anthracene, binaphthyl, phenanthrene, pyrene, dihydropyrene, chrysene, perylene, tetracene, pentacene, benzopyrene, fluorene, indene, indenofluorene, spirobifluorene, more preferably 1,4-phenylene, 4,4'-biphenylene, 1, 4-tephenylene.

Preferred heteroaryl groups are, for example, 5 membered rings, such as pyrrole, pyrazole, imidazole, 1,2,3-triazole, 1,2,4-triazole, tetrazole, furan, thiophene, selenophene, oxazole, isoxazole, 1,2 thiazole, 1,3-thiazole, 1,2,3-oxadiazole, 1,2,4 oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6 membered rings, such as pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, or condensed groups, such as indole, iso-indole, indolizine, indazole, benzimidazole, benzotriazole, purine, naphthimidazole, phenanthrimidazole, pyridimidazole, pyrazinimidazole, quinoxalinimidazole, benzoxazole, naphthoxazole, anthroxazole, phen-anthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]-thiophene, dithienothiophene, isobenzothiophene, dibenzothiophene, benzothiadiazothiophene, or combinations of these groups. The heteroaryl groups may also be substituted by alkyl, alkoxy, thioalkyl, fluorine, fluoroalkyl or further aryl or heteroaryl groups.

In the context of this application, the term "(non-aromatic) alicyclic and heterocyclic groups" encompass both saturated rings, i.e. those that contain exclusively single bonds, and partially unsaturated rings, i.e. those that may also contain multiple bonds. Heterocyclic rings contain one or more heteroatoms, preferably selected from Si, O, N, S and Se. The (non-aromatic) alicyclic and heterocyclic groups can be monocyclic, i.e. contain only one ring (such as, for example, cyclohexane), or polycyclic, i.e. contain a plurality of rings (such as, for example, decahydro-naphthalene or bicyclooctane). Particular preference is given to saturated groups. Preference is furthermore given to mono-, bi- or tricyclic groups having 3 to 25 C atoms, which optionally contain fused rings and that are optionally substituted. Preference is furthermore given to 5-, 6-, 7- or 8-membered carbocyclic groups in which, in addition, one or more C atoms may each be replaced by Si and/or one or more CH groups may each be replaced by N and/or one or more non-adjacent $CH_2$ groups may each be replaced by —O— and/or —S—. Preferred alicyclic and heterocyclic groups are, for example, 5-membered groups, such as cyclopentane, tetrahydrofuran, tetrahydrothiofuran, pyrrolidine, 6-membered groups, such as cyclohexane, silinane, cyclohexene, tetrahydropyran, tetrahydrothiopyran, 1,3-dioxane, 1,3-dithiane, piperidine, 7-membered groups, such as cycloheptane, and fused groups, such as tetrahydronaphthalene, decahydronaphthalene, indane, bicyclo[1.1.1]-pentane-1,3-diyl, bicyclo[2.2.2]octane-1,4-diyl, spiro[3.3]heptane-2,6-diyl, octahydro-4,7-methanoindane-2,5-diyl, more preferably 1,4-cyclohexylene 4,4'-bicyclohexylene, 3,17-hexadecahydro-cyclopenta[a]phenanthrene, optionally being substituted by one or more identical or different groups L.

Especially preferred aryl-, heteroaryl-, alicyclic- and heterocyclic groups are 1,4-phenylene, 4,4'-biphenylene, 1, 4-terphenylene, 1,4-cyclohexylene, 4,4'-bicyclohexylene, and 3,17-hexadecahydro-cyclopenta[a]-phenanthrene, optionally being substituted by one or more identical or different groups L.

Preferred substituents (L) of the above-mentioned aryl-, heteroaryl-, alicyclic- and heterocyclic groups are, for example, solubility-promoting groups, such as alkyl or alkoxy and electron-withdrawing groups, such as fluorine, nitro or nitrile. Particularly preferred substituents are, for example, F, Cl, CN, $NO_2$, $CH_3$, $C_2H_5$, $OCH_3$, $OC_2H_5$, $COCH_3$, $COC_2H_5$, $COOCH_3$, $COOC_2H_5$, $CF_3$, $OCF_3$, $OCHF_2$ or $OC_2F_5$.

For the present invention,

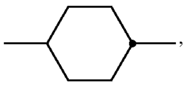, 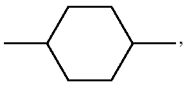,

-continued

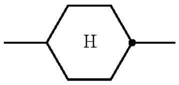 and 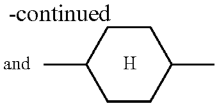

denote trans-1,4-cyclohexylene, and

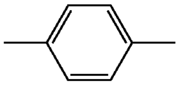 and 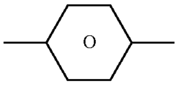

denote 1,4-phenylene.

Above and below "halogen" denotes F, Cl, Br or I.

Above and below, the terms "alkyl", "aryl", "heteroaryl", etc., also encompass polyvalent groups, for example alkylene, arylene, heteroarylene, etc. The term "aryl" denotes an aromatic carbon group or a group derived there from. The term "heteroaryl" denotes "aryl" in accordance with the above definition containing one or more heteroatoms.

Preferred alkyl groups are, for example, methyl, ethyl, n propyl, isopropyl, n butyl, isobutyl, s butyl, t butyl, 2 methylbutyl, n pentyl, s pentyl, cyclo-pentyl, n hexyl, cyclohexyl, 2 ethylhexyl, n heptyl, cycloheptyl, n octyl, cyclooctyl, n nonyl, n decyl, n undecyl, n dodecyl, dodecanyl, trifluoro-methyl, perfluoro-n-butyl, 2,2,2-trifluoroethyl, perfluorooctyl, perfluoro-hexyl, etc.

Preferred alkoxy groups are, for example, methoxy, ethoxy, 2-methoxy-ethoxy, n-propoxy, i-propoxy, n-butoxy, i-butoxy, s-butoxy, t-butoxy, 2-methylbutoxy, n-pentoxy, n-hexoxy, n-heptoxy, n-octoxy, n-nonoxy, n-decoxy, n-undecoxy, and n-dodecoxy.

Preferred alkenyl groups are, for example, ethenyl, propenyl, butenyl, pentenyl, cyclopentenyl, hexenyl, cyclohexenyl, heptenyl, cycloheptenyl, octenyl, cyclooctenyl.

Preferred alkynyl groups are, for example, ethynyl, propynyl, butynyl, pentynyl, hexynyl, octynyl.

Preferred amino groups are, for example, dimethylamino, methylamino, methylphenylamino, phenylamino.

The term "reactive mesogen" or "RM" denotes a compound containing one mesogenic group and one or more functional groups, which are suitable for polymerization (also referred to as polymerizable group or group P).

The terms "low-molecular-weight compound" and "unpolymerizable compound" denote compounds, usually monomeric, which contain no functional group, which is suitable for polymerization under the usual conditions known to the person skilled in the art, in particular under the conditions used for the polymerization of RMs.

The term "low molecular" preferably means, that the relative molecular weight of a compound is less than 2000 g/mol.

Definitions such as "alkyl, alkoxy, alkylcarbonyl, alkoxycarbonyl, alkylcarbonyloxy or alkoxycarbonyloxy having 1 to 12 C atoms", etc., mean that the radicals containing a carbonyl group (CO) and the unsaturated radicals, such as alkenyl and alkynyl, have at least two C atoms, and the branched radicals have at least three C atoms.

The polymerizable group, such as, for example $P^{a,b}$, is a group which is suitable for a polymerization reaction, such as, for example, free radical or ionic chain polymerization, polyaddition or polycondensation, or for a polymer-analogous reaction, for example addition or condensation onto a main polymer chain. Particular preference is given to groups for chain polymerization, in particular those containing a C═C double bond or —C≡C— triple bond, and groups which are suitable for polymerization with ring opening, such as, for example, oxetane or epoxide groups.

Preferred polymerizable groups such as, for example $P^{a,b}$, are selected from the group consisting of $CH_2$═$CW^1$—CO—O—, $CH_2$═$CW^1$—CO—,

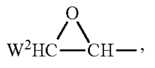, 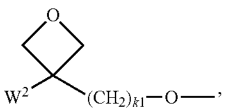, 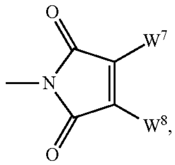,

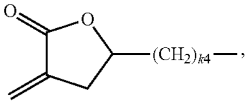, $CH_2$═$CW^2$—$(O)_{k3}$—, $CW^1$═CH—CO—$(O)_{k3}$—, $CW^1$═CH—CO—NH—, $CH_2$═$CW^1$—CO—NH—, $CH_3$—CH═CH—O—, $(CH_2$═$CH)_2$CH—OCO—, $(CH_2$═CH—$CH_2)_2$CH—OCO—, $(CH_2$═$CH)_2$CH—O—, $(CH_2$═CH—$CH_2)_2$N—, $(CH_2$═CH—$CH_2)_2$N—CO—, HO—$CW^2W^3$—, HS—$CW^2W^3$—, $HW^2$N—, HO—$CW^2W^3$—NH—, $CH_2$═$CW^1$—CO—NH—, $CH_2$═CH—$(COO)_{k1}$-Phe-$(O)_{k2}$—, $CH_2$═CH—$(CO)_{k1}$-Phe-$(O)_{k2}$—, Phe-CH═CH—, HOOC—, OCN— and $W^4W^5W^6$Si—, in which $W^1$ denotes H, F, Cl, CN, $CF_3$, phenyl or alkyl having 1 to 5 C atoms, in particular H, F, Cl or $CH_3$, $W^2$ and $W^3$ each, independently of one another, denote H or alkyl having 1 to 5 C atoms, in particular H, methyl, ethyl or n-propyl, $W^4$, $W^5$ and $W^6$ each, independently of one another, denote Cl, oxaalkyl or oxacarbonylalkyl having 1 to 5 C atoms, $W^7$ and $W^8$ each, independently of one another, denote H, Cl or alkyl having 1 to 5 C atoms, Phe denotes 1,4-phenylene, which is optionally substituted by one or more radicals L as defined above which are other than P-Sp-, $k_1$, $k_2$ and $k_3$ each, independently of one another, denote 0 or 1, $k_3$ preferably denotes 1, and $k_4$ denotes an integer from 1 to 10.

Particularly preferred polymerizable groups such as, for example $P^{a,b}$, are selected from the group consisting of $CH_2$═$CW^1$—CO—O—, $CH_2$═$CW^1$—CO—,

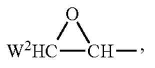, 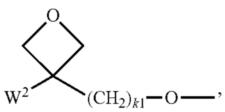, 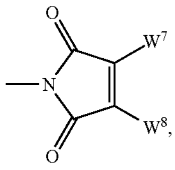,

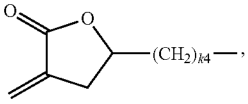, $CH_2$═$CW^2$—O—, $CW^1$═CH—CO—$(O)_{k3}$—, $CW^1$═CH—CO—NH—, $CH_2$═$CW^1$—CO—NH—, $(CH_2$═$CH)_2$CH—OCO—, $(CH_2$═CH—$CH_2)_2$CH—OCO—, $(CH_2$═$CH)_2$CH—O—, $(CH_2$═CH—$CH_2)_2$N—, $(CH_2$═CH—$CH_2)_2$N—CO—, $CH_2$═$CW^1$—CO—NH—, $CH_2$═CH—$(COO)_{k1}$-Phe-$(O)_{k2}$—, $CH_2$═CH—$(CO)_{k1}$-Phe-$(O)_{k2}$—, Phe-CH═CH— and $W^4W^5W^6$Si—, in which $W^1$ denotes H, F, Cl, CN, $CF_3$, phenyl or alkyl having 1 to 5 C atoms, in particular H, F, Cl or $CH_3$, $W^2$ and $W^3$ each, independently of one another, denote H or alkyl having 1 to 5 C atoms, in particular H, methyl, ethyl or n-propyl, $W^4$, $W^5$ and $W^6$ each, independently of one another, denote Cl, oxaalkyl or oxacarbonylalkyl having 1 to 5 C atoms, $W^7$ and $W^8$ each, independently of one another, denote H, Cl or alkyl having 1 to 5 C atoms, Phe denotes 1,4-phenylene, $k_1$, $k_2$ and $k_3$ each, independently of one another, denote 0 or 1, $k_3$ preferably denotes 1, and $k_4$ denotes an integer from 1 to 10.

Very particularly preferred polymerizable groups such as, for example $P^{a,b}$, are selected from the group consisting of $CH_2$═$CW^1$—CO—O—, in particular $CH_2$═CH—CO—O—, $CH_2$═$C(CH_3)$—CO—O— and $CH_2$═CF—CO—O—, furthermore $CH_2$═CH—O—, $(CH_2$═$CH)_2$CH—O—CO—, $(CH_2$═$CH)_2$CH—O—,

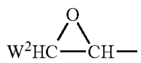 and 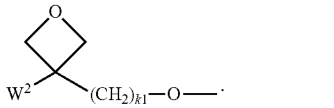.

Further very particularly preferred polymerizable groups such as, for example $P^{a,b}$, are selected from the group consisting of vinyloxy, acrylate, methacrylate, fluoroacrylate, chloroacrylate, oxetane and epoxide groups, and particularly preferably denote an acrylate or methacrylate group.

The term “spacer group” or “spacer”, also referred to as “Sp” above and below, is known to the person skilled in the art and is described in the literature, see, for example, Pure Appl. Chem. 73(5), 888 (2001) and C. Tschierske, G. Pelzl, S. Diele, Angew. Chem. 2004, 116, 6340-6368. Unless indicated otherwise, the term “spacer group” or “spacer” above and below denotes a flexible group, which connects the mesogenic group, and the polymerizable group(s) to one another in a polymerizable mesogenic compound.

Preferred spacer groups $Sp^{a,b}$ are selected from the formula Sp'-X', so that the radical $P^{a/b}$-$Sp^a$/b- conforms to the formula $P^{a/b}$-Sp'-X'—, where Sp' denotes alkylene having 1 to 20, preferably 1 to 12, C atoms, which is optionally mono- or polysubstituted by F, Cl, Br, I or CN, and in which, in addition, one or more non-adjacent $CH_2$ groups may each be replaced, independently of one another, by —O—, —S—, —NH—, —N($R^a$)—, —Si($R^aR^{aa}$)—, —CO—, —CO—O—, —O—CO—, —O—CO—O—, —S—CO—, —CO—S—, —N($R^a$)—CO—O—, —O—CO—N($R^a$)—, —N($R^a$)—CO—N($R^a$)—, —CH═CH— or —C≡C— in such a way that O and/or S atoms are not linked directly to one another, preferably —$(CH_2)_{p1}$—, —$(CH_2CH_2O)_{q1}$—$CH_2CH_2$—, —$CH_2CH_2$—S—$CH_2CH_2$—, —$CH_2CH_2$—NH—$CH_2CH_2$— or —$(SiR^{00}R^{00}$—$O)_{p1}$—, in which p1 is an integer from 1 to 12, q1 is an integer from 1 to 3, X' denotes —O—, —S—, —CO—, —CO—O—, —O—CO—, —O—CO—O—, —CO—N($R^a$)—, —N($R^a$)—CO—, —N($R^a$)—CO—N($R^{aa}$)—, —$OCH_2$—, —$CH_2O$—, —$SCH_2$—, —$CH_2S$—, —$CF_2O$—, —$OCF_2$—, —$CF_2S$—, —$SCF_2$—, —$CF_2CH_2$—, —$CH_2CF_2$—, —$CF_2CF_2$—, —CH═N—, —N═CH—, —N═N—, —CH═$CR^a$—, —$CY^2$═$CY^3$—, —C≡C—, —CH═CH—CO—O—, —O—CO—CH═CH— or a single bond, preferably —O—, —S—, —CO—, —COO—, —OCO—, —O—COO—, —CO—$NR^a$—, —$NR^a$—CO—, —$NR^a$—CO—$NR^{aa}$— or a single bond.

$R^a$ and $R^{aa}$ each, independently of one another, denote H or alkyl having 1 to 12 C atoms, and $Y^2$ and $Y^3$ each, independently of one another, denote H, F, Cl or CN.

Particularly preferred groups Sp' are, for example, in each case straight-chain ethylene, propylene, butylene, pentylene, hexylene, heptylene, octylene, nonylene, decylene, undecylene, dodecylene, octadecylene, ethyleneoxyethylene, methyleneoxybutylene, ethylenethioethylene, ethylene-N-methyliminoethylene, 1-methylalkylene, ethenylene, propenylene and butenylene.

Particularly preferred groups -Sp'-X'— are $—(CH_2)_{p1}—$, $—(CH_2)_{p1}—O—$, $—(CH_2)_{p1}—O—CO—$, and $—(CH_2)_{p1}—O—CO—O—$, in which p1 and q1 have the meanings indicated above.

The term "polymerization" means the chemical process to form a polymer by bonding together multiple polymerizable units or polymer precursors containing such polymerizable units.

The term "polymer" means a long or larger molecule consisting of a chain or network of many repeating units, formed by chemically bonding together many small molecules called monomers. A polymer is formed by polymerization, the joining of many monomer molecules or polymer precursors.

A "polymer network" is a network in which all polymer chains are interconnected to form a single macroscopic entity by many crosslinks.

The polymer network can occur in the following types:

- A graft polymer molecule is a branched polymer molecule in which one or more the side chains are different, structurally or configurationally, from the main chain.
- A star polymer molecule is a branched polymer molecule in which a single branch point gives rise to multiple linear chains or arms. If the arms are identical, the star polymer molecule is said to be regular. If adjacent arms are composed of different repeating subunits, the star polymer molecule is said to be variegated.
- A comb polymer molecule consists of a main chain with two or more three-way branch points and linear side chains. If the arms are identical, the comb polymer molecule is said to be regular.
- A brush polymer molecule consists of a main chain with linear, unbranched side chains and where one or more of the branch points has four-way functionality or larger.

The term "alignment" or "orientation" relates to alignment (orientation ordering) of anisotropic units of material such as small molecules or fragments of big molecules in a common direction named "alignment direction". In an aligned layer of liquid-crystalline material, the liquid-crystalline director coincides with the alignment direction so that the alignment direction corresponds to the direction of the anisotropy axis of the material.

The term "planar orientation/alignment", for example in a layer of an liquid-crystalline material, means that the long molecular axes (in case of calamitic compounds) or the short molecular axes (in case of discotic compounds) of a proportion of the liquid-crystalline molecules are oriented substantially parallel (about 180°) to the plane of the layer.

The term "homeotropic orientation/alignment", for example in a layer of a liquid-crystalline material, means that the long molecular axes (in case of calamitic compounds) or the short molecular axes (in case of discotic compounds) of a proportion of the liquid-crystalline molecules are oriented at an angle θ ("tilt angle") between about 80° to 90° relative to the plane of the layer.

The wavelength of light generally referred to in this application is 550 nm, unless explicitly specified otherwise.

The birefringence Δn herein is defined in the following equation $$\Delta n = n_e - n_o$$

wherein $n_e$ is the extraordinary refractive index and $n_o$ is the ordinary refractive index, and the average refractive index $n_{av.}$ is given by the following equation.

$$n_{av.} = [(2n_o^2 + n_e^2)/3]^{1/2}$$

The extraordinary refractive index $n_e$ and the ordinary refractive index $n_o$ can be measured using an Abbe refractometer, Δn can then be calculated.

In the present application the term "dielectrically positive" is used for compounds or components with $\Delta\varepsilon > 3.0$, "dielectrically neutral" with $-1.5 \le \Delta\varepsilon \le 3.0$ and "dielectrically negative" with $\Delta\varepsilon < -1.5$. Δε is determined at a frequency of 1 kHz and at 20° C. The dielectric anisotropy of the respective compound is determined from the results of a solution of 10% of the respective individual compound in a nematic host mixture. In case the solubility of the respective compound in the host medium is less than 10% its concentration is reduced by a factor of 2 until the resultant medium is stable enough at least to allow the determination of its properties. Preferably, the concentration is kept at least at 5%, however, in order to keep the significance of the results as high as possible. The capacitance of the test mixtures are determined both in a cell with homeotropic and with homogeneous alignment. The cell gap of both types of cells is approximately 20 μm. The voltage applied is a rectangular wave with a frequency of 1 kHz and a root mean square value typically of 0.5 V to 1.0 V, however, it is always selected to be below the capacitive threshold of the respective test mixture.

Δε is defined as $(\varepsilon\| - \varepsilon_\perp)$, whereas $\varepsilon_{av.}$ is $(\varepsilon\| + 2\varepsilon_\perp)/3$.

The following abbreviations are used to illustrate the liquid crystalline phase behavior of the compounds and or mixtures: K=crystalline; N=nematic; S=smectic; Ch=cholesteric; I=isotropic; Tg=glass transition.

The numbers between the symbols indicate the phase transition temperatures in ° C.

All physical properties are and have been determined in accordance with "Merck Liquid Crystals, Physical Properties of Liquid Crystals", Status November 1997, Merck KGaA, Germany, and apply for a temperature of 20° C., and Δn is determined at 589 nm and Δε at 1 kHz, unless explicitly indicated otherwise in each case.

Throughout the description and claims of this specification, the words "comprise" and "contain" and variations of the words, for example "comprising" and "comprises", mean "including but not limited to", and are not intended to (and do not) exclude other components. On the other hand, the word "comprise" also encompasses the term "consisting of" but is not limited to it.

All concentrations are quoted in percent by weight and relate to the respective mixture as a whole, all temperatures are quoted in degrees Celsius and all temperature differences are quoted in differential degrees.

DETAILED DESCRIPTION

In a preferred embodiment of the invention, $P^a$ and/or $P^b$ in formula I denote a radical containing two or more polymerizable groups (multifunctional polymerizable radicals). Suitable radicals of this type and polymerizable compounds containing them and the preparation thereof are described, for example, in U.S. Pat. No. 7,060,200 B1 or US 2006/0172090 A1. Particular preference is given to multifunctional polymerizable radicals selected from the following formulae:

$—X\text{-alkyl-}CHP^1—CH_2—CH_2P^2$ I*a $—X\text{-alkyl-}C(CH_2P^1)(CH_2P^2)—CH_2P^3$ I*b $—X\text{-alkyl-}CHP^1CHP^2—CH_2P^3$ I*c $—X\text{-alkyl-}C(CH_2P^1)(CH_2P^2)—C_{aa}H_{2aa+1}$ I*d $—X\text{-alkyl-}CHP^1—CH_2P^2$ I*e $—X\text{-alkyl-}CHP^1P^2$ I*f $—X\text{-alkyl-}CP^1P^2—C_{aa}H_{2aa+1}$ I*g $—X\text{-alkyl-}C(CH_2P^1)(CH_2P^2)—CH_2OCH_2—C(CH_2P^3)(CH_2P^4)CH_2P^5$ I*h $—X\text{-alkyl-}CH((CH_2)_{aa}P^1)((CH_2)_{bb}P^2)$ I*i $—X\text{-alkyl-}CHP^1CHP^2—C_{aa}H_{2aa+1}$ I*k $—X\text{-alkyl-}C(CH_3)(CH_2P^1)(CH_2P^2)$ I*m in which alkyl denotes a single bond or straight-chain or branched alkylene having 1 to 12 C atoms, in which one or more non-adjacent $CH_2$ groups may each be replaced, independently of one another, by $—C(R^0)=C(R^{00})—$, —C≡C—, $—N(R^{00})—$, —O—, —S—, —CO—, —CO—O—, —O—CO—, or —O—CO—O— in such a way that O and/or S atoms are not linked directly to one another, and in which, in addition, one or more H atoms may each be replaced by F, Cl or CN, where $R^0$ and $R^{00}$ have the meanings indicated above, aa and bb each, independently of one another, denote 0, 1, 2, 3, 4, 5 or 6, X has one of the meanings indicated for X', and $P^{1-5}$ each, independently of one another, have one of the meanings indicated for $P^a$.

$A^1$, $A^2$, $A^3$ and $A^4$ in formula I preferably each, independently of one another, denote a radical as given above, particularly preferably selected from the group consisting of the following formulae:

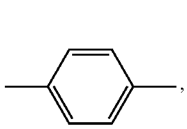,
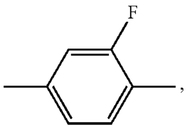,
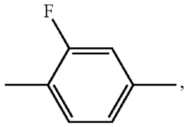,
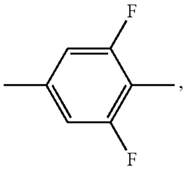,
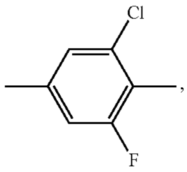,
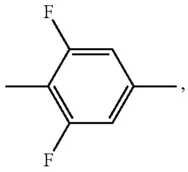,

-continued

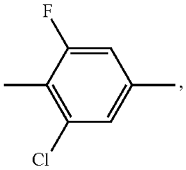,
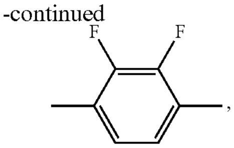,
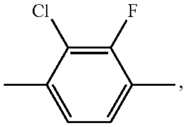,
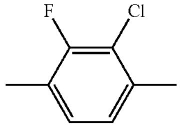,
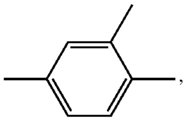,
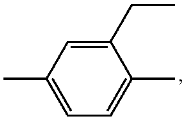,
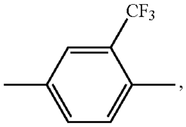,
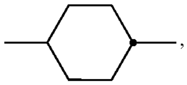,
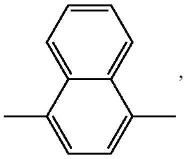,
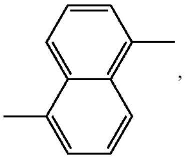,
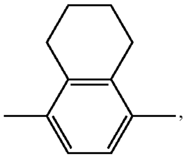,
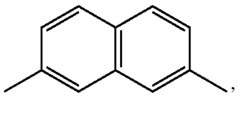,
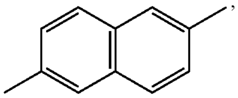, in which the individual rings may also additionally be mono- or polysubstituted by L as described above and below.

$A^1$, $A^2$, $A^3$ and $A^4$ in formula I particularly preferably each, independently of one another, denote a radical selected from the group consisting of the following formulae:

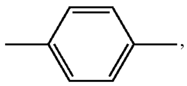,
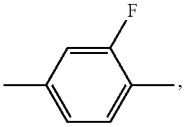,
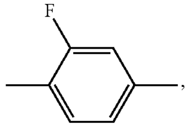,
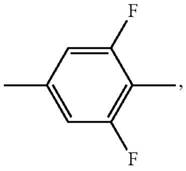,
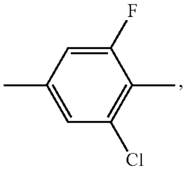,
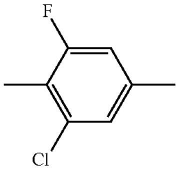
and
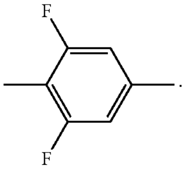.

$A^1$, $A^2$, $A^3$ and $A^4$ in formula I furthermore preferably each, independently of one another, denote a radical selected from the group consisting of the following formulae:

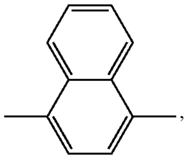, 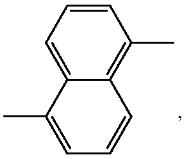, 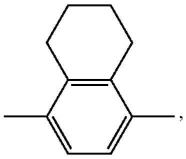, 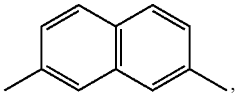, 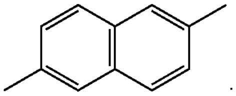.

Further particularly preferred compounds of the formula I and sub-formulae thereof indicated above and below are those in which $Q^1$ denotes a group —$CF_2O$—, $Q^1$ denotes a group —$OCF_2$—, s1 and s2 each denote 1, n1 and n2 each denote 0, n1 denotes 1 and n2 denotes 0 or n1 denotes 0 and n2 denotes 1, $A^3$ denotes a group of the formula

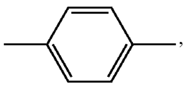, 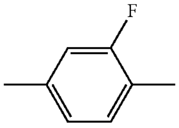 or

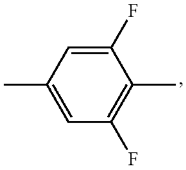, $A^2$ denotes a group of the formula

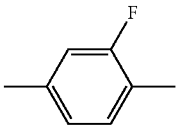 or 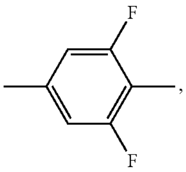, particularly preferably

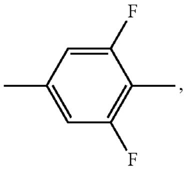, $A^2$ and $Q^1$ together denote a group of the formula

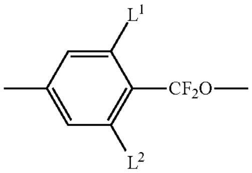

in which $L^1$ and $L^2$ independently denote H, Cl or F, preferably $L^1$=F and $L^2$ denotes H or F, and particularly preferably $L^1$ and $L^2$ both denote F.

The compounds of the formula I are therefore particularly preferably compounds of the formula

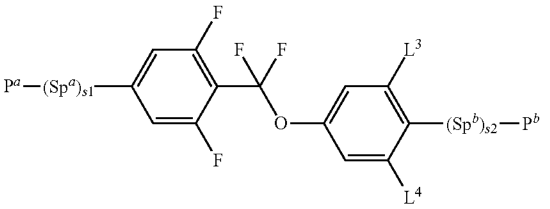

in which $P^a$, $P^b$, $Sp^a$, $Sp^b$, s1, s2 are as defined for formula I, and $L^3$ and $L^4$, independently of one another, denote H or F.

A high degree of fluorination in the rings $A^2$ and $A^3$ makes the polymerizable compounds very readily combinable with mixtures of compounds containing polyfluorinated aromatic rings.

Particularly preferred compounds of the formula I are selected from the group consisting of the following formulae:

I1

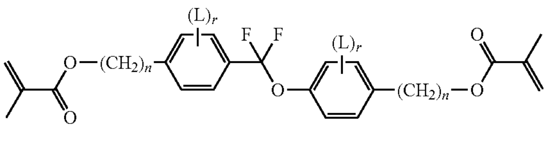

I2

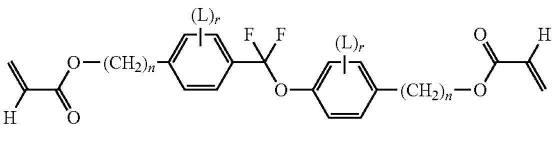

I3

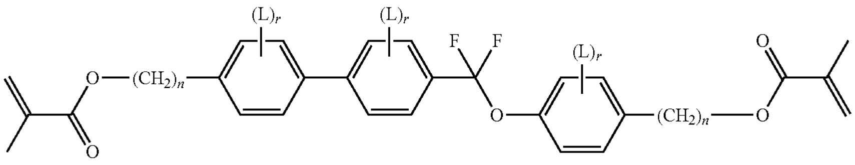

-continued
I4
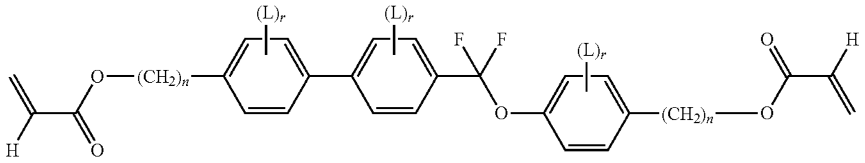
I5
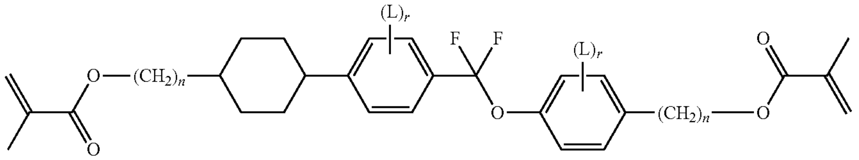
I7
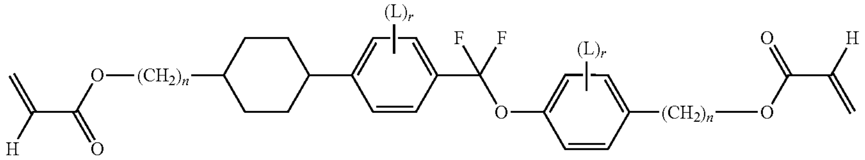
I7
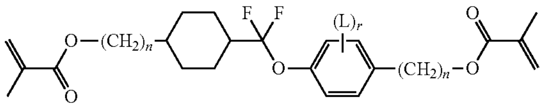
I8
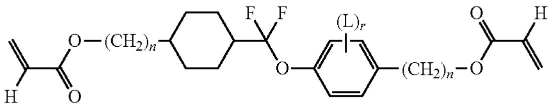
I9
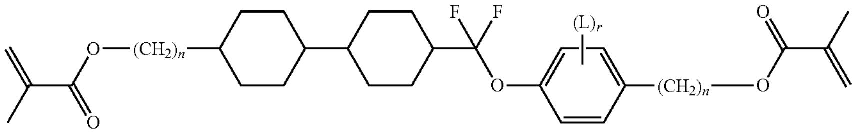
I10
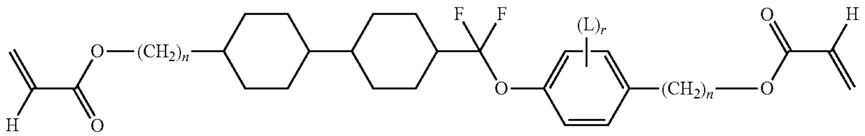
I11
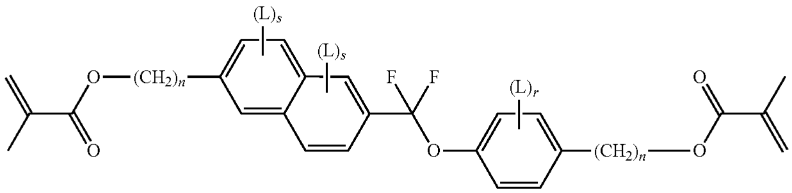
I12
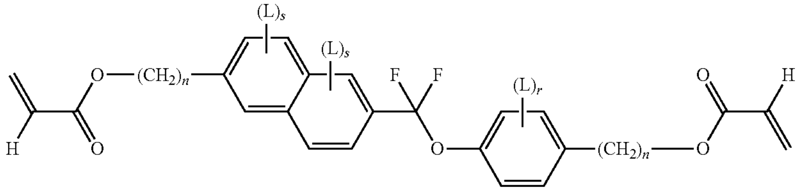
I13
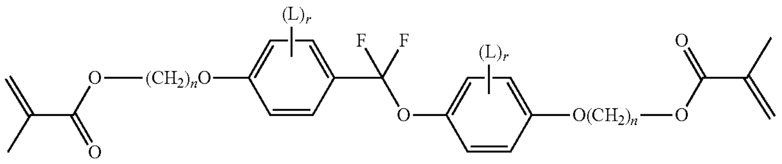

-continued
I14
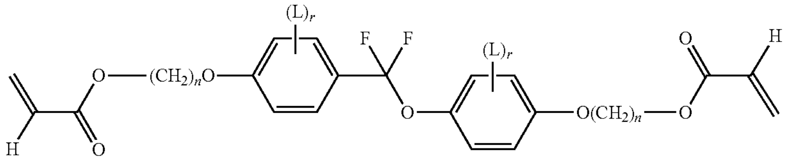
I15
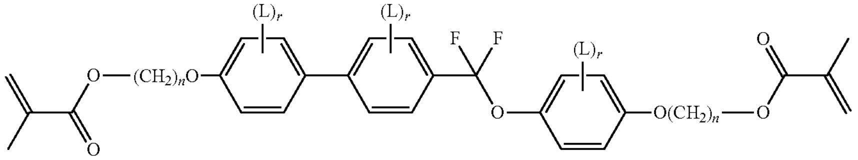
I16
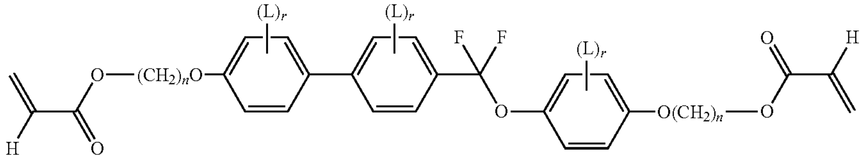
I17
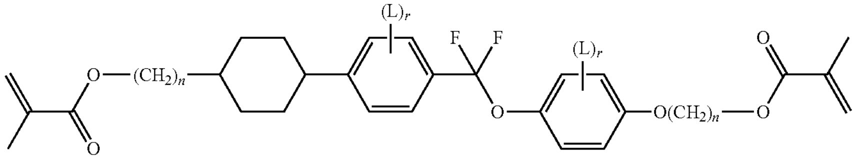
I18
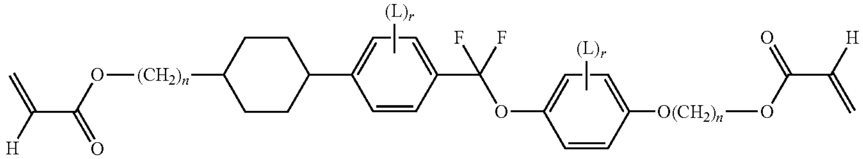
I19
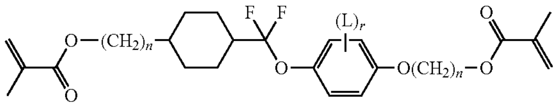
I20
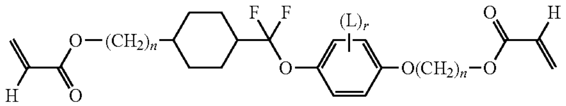
I21
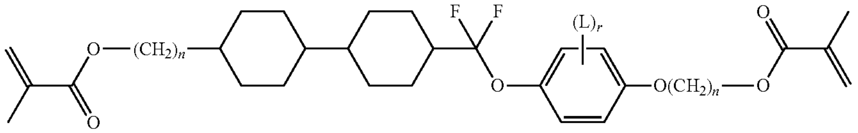
I22
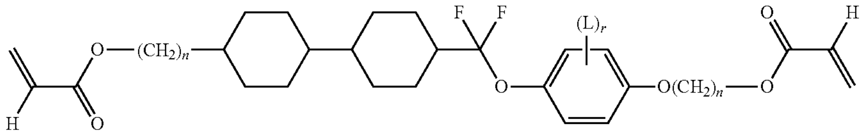
I23
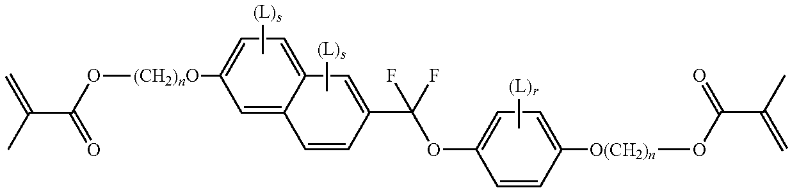

-continued

I24

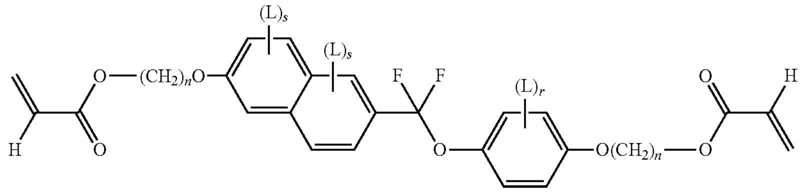

I25

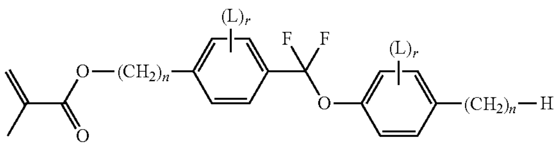

I26

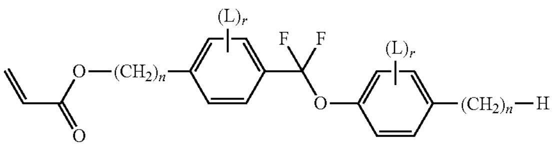

I27

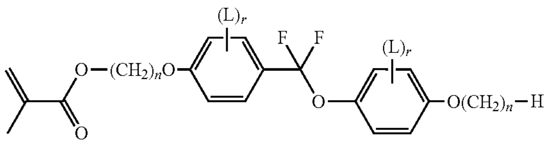

I28

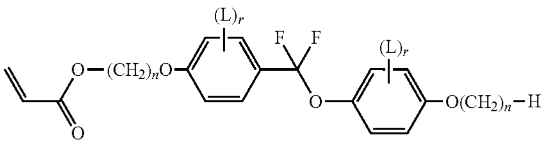

in which L on each occurrence, identically or differently, has one of the meanings indicated above and below, r denotes 0, 1, 2, 3 or 4, s denotes 0, 1, 2 or 3, and n denotes an integer between 1 and 20 preferably between 1 and 12, very particularly preferably between 2 and 8, and in which, if a radical at the end of a single or double bond is not named, it is a terminal $CH_3$ or $CH_2$ group. r is preferably 0, 1 or 2, and particularly preferably 1 or 2. Of these, very particular preference is given to the compounds of the formulae I1, I2, I3 and I4 and very particularly the compounds of the formulae I1 and I2, especially the compounds of the formulae I2.

In the formulae I1-I28,

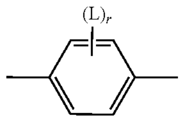

preferably denotes a group selected from the group consisting of the following formulae:

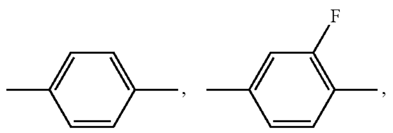

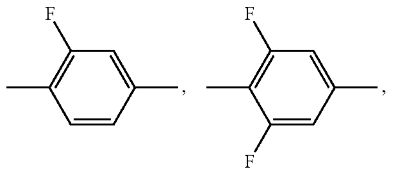

-continued

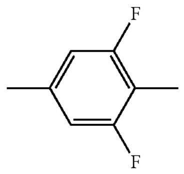

and

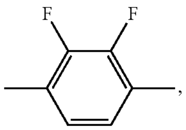

particularly preferably

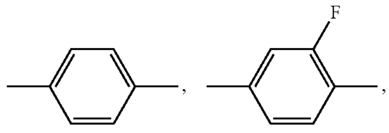

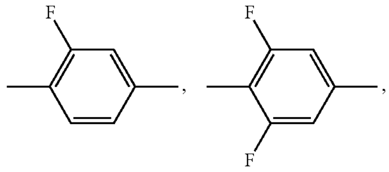

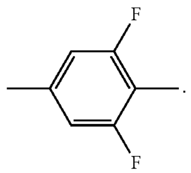

Of the compounds of the formula I, preference is given to those containing two ring systems (n1, n2=0), in particular compounds selected from the compounds of the formulae Ia to Iq:

-continued
Ia
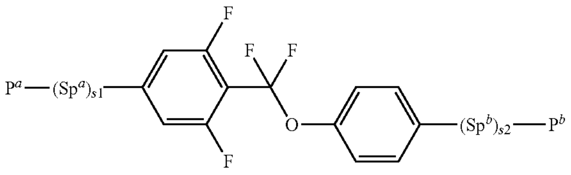
Ib
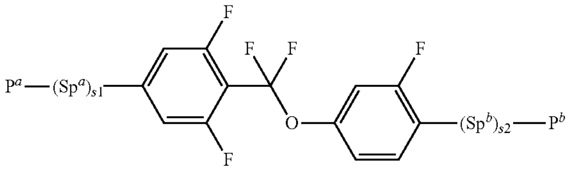
Ic
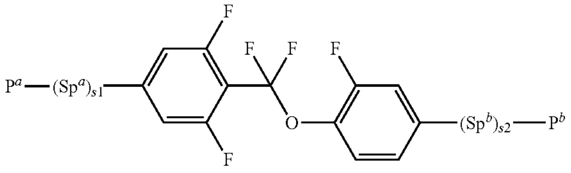
Id
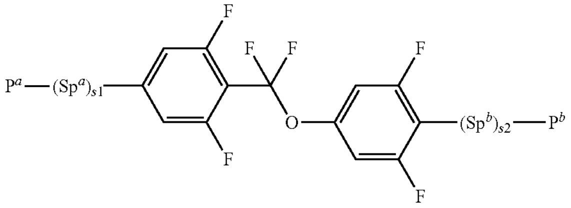
Ie
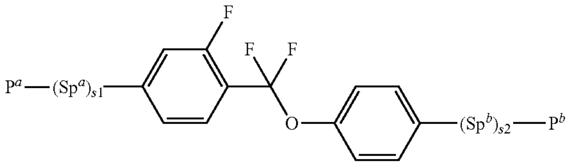
If
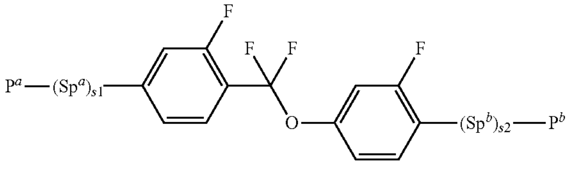
Ig
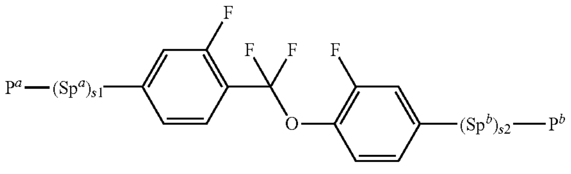
Ih
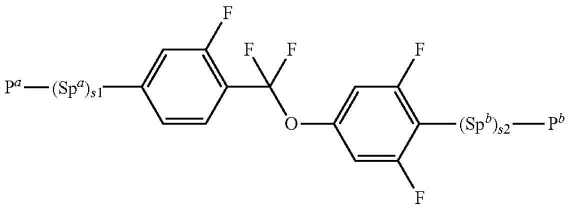
Ii
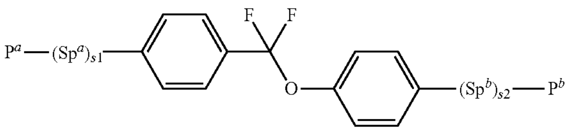
Ij
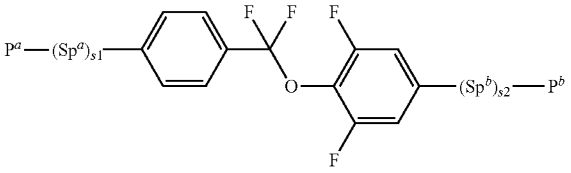
Ik
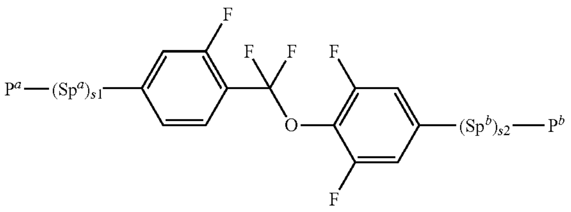
Il
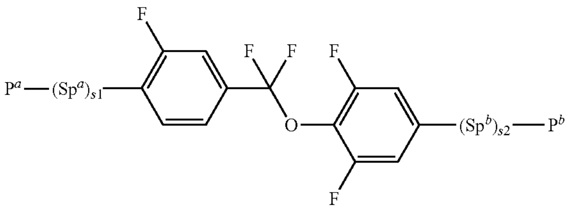
Im
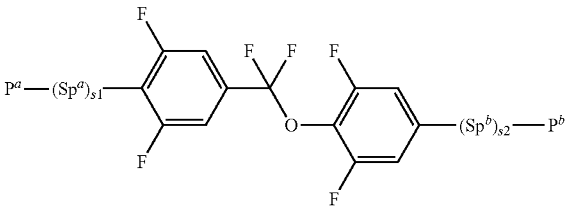
In
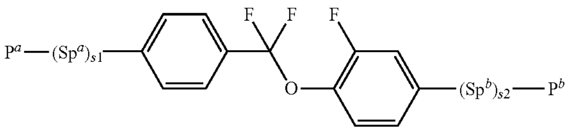

-continued

Io

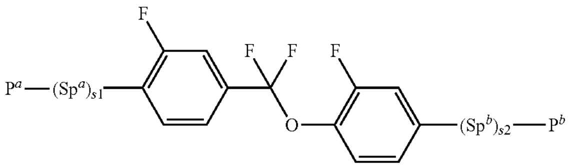

Ip

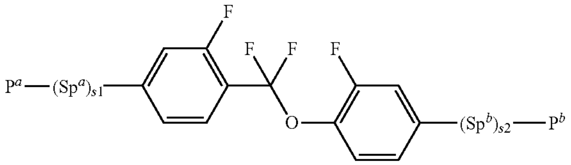

Iq

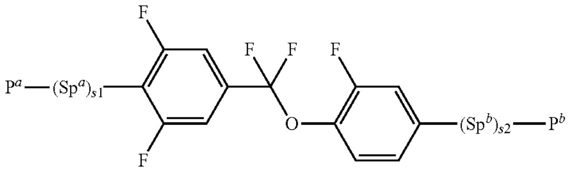

in which $P^a$, $P^b$, $Sp^a$, $Sp^b$, s1 and s2 are as defined for formula I. $Sp^{a/b}$ here preferably denote an alkylene group $—(CH_2)_n—$, where n=3, 4, 5, 6 or 7, and $P^{a/b}$ preferably denote a methacrylate or acrylate group or H, in particular a methacrylate or acrylate group. Of these, particular preference is given to the compounds of the formulae Ia, Ib, Ic, Id, Ie, If, Ig and Ih and very particularly of the formula Ia.

Of the compounds of the formula I, particular preference is given to those in which the radicals $P^a$ and $P^b$ are selected from the group consisting of vinyloxy, acrylate, methacrylate, fluoroacrylate, chloroacrylate, oxetane and epoxide groups, particularly preferably acrylate or methacrylate groups, the radicals $Sp^a$ and $Sp^b$ are selected from the group consisting of $—(CH_2)_{p1}—$, $—(CH_2)_{p1}—O—$, $—(CH_2)_{p1}—O—CO—$ and $—(CH_2)_{p1}—O—CO—O—$ and mirror images thereof, in which p1 denotes an integer from 1 to 12, preferably from 1 to 6, particularly preferably 1, 2 or 3, where these radicals are linked to $P^a$ or $P^b$ in such a way that O atoms are not directly adjacent.

The compounds of the formula I and sub-formulae thereof can be prepared analogously to processes known to the person skilled in the art and described in standard works of organic chemistry, such as, for example, in Houben-Weyl, Methoden der organischen Chemie [Methods of Organic Chemistry], Thieme-Verlag, Stuttgart.

Particularly suitable and preferred processes for the preparation of compounds of the formula I and sub-formulae thereof are described, for example in EP 2714844 A1.

The polymerizable compounds of formula I can be polymerized individually, but it is also possible to polymerize mixtures which comprise two or more polymerizable compounds according to the invention, or mixtures comprising one or more polymerizable compounds according to the invention and one or more further polymerizable compounds (co-monomers), which are preferably mesogenic or liquid-crystalline. In the case of polymerization of such mixtures, copolymers form. Preference is given to the use of a mixture comprising two or more compounds according to the invention or a mixture comprising one or more compounds according to the invention with one or more further polymerizable compounds. The invention furthermore relates to the polymerizable mixtures mentioned above and below. The further polymerizable compounds and co-monomers are mesogenic or non-mesogenic, preferably mesogenic or liquid-crystalline.

Suitable and preferred comonomers for use in displays according to the invention are selected, for example, from the following formulae:

M1

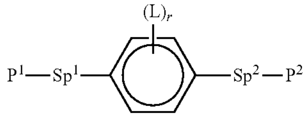

M2

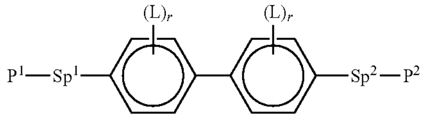

M3

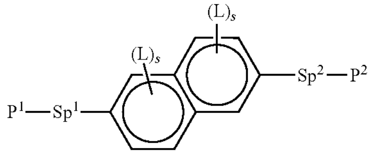

M4

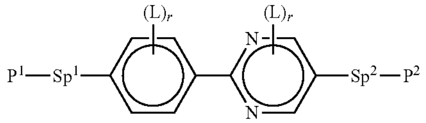

M5

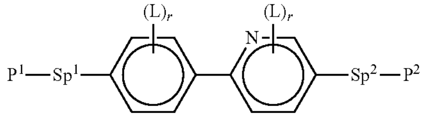

M6

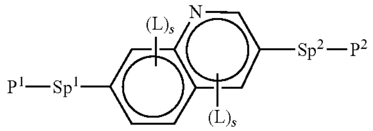

M7

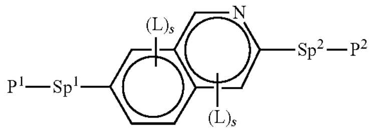

M8

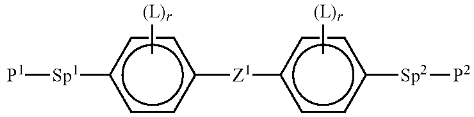

M9

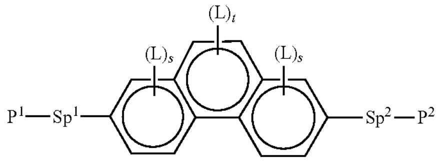

-continued

M10

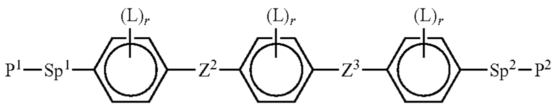

M11

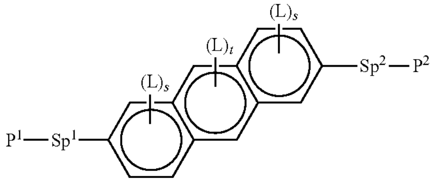

M12

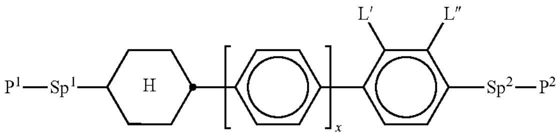

M13

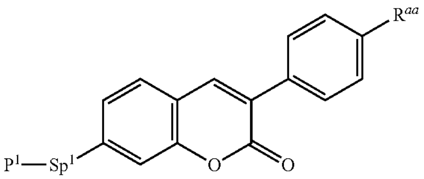

M14

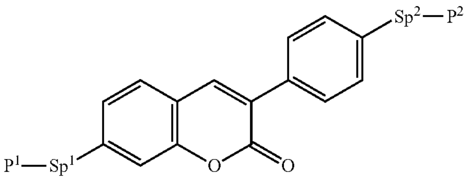

M15

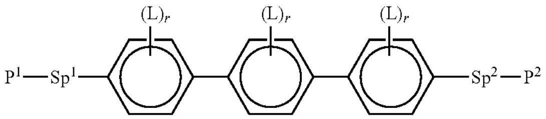

M16

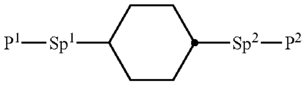

M17

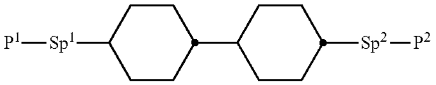

M18

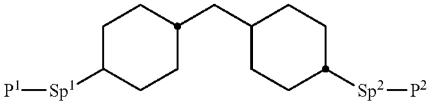

M19

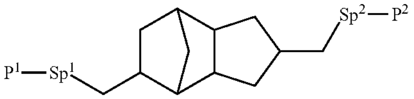

M20

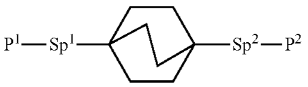

-continued

M21

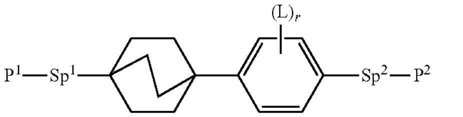

M22

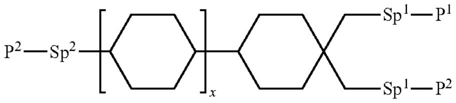

M23

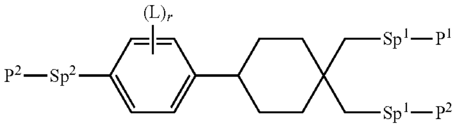

M24

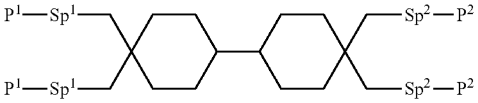

M25

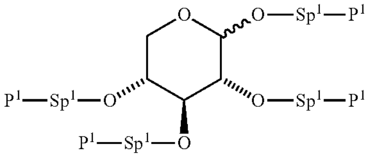

M26

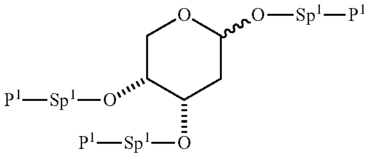

M27

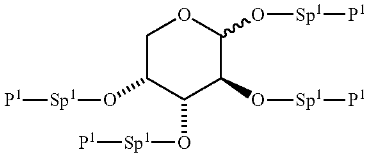

M28

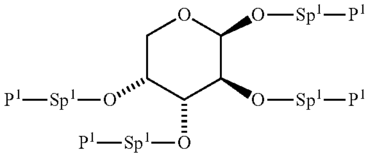

M29

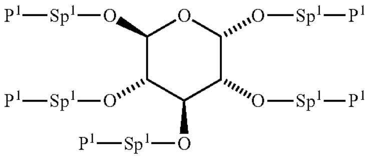

in which the individual radicals have the following meanings:

$P^1$ and $P^2$ each, independently of one another, denote a polymerizable group, preferably having one of the meanings indicated above and below for $P^a$, particularly preferably an acrylate, methacrylate, fluoroacrylate, oxetane, vinyloxy or epoxide group, $Sp^1$ and $Sp^2$ each, independently of one another, denote a single bond or a spacer group, preferably having one of the meanings indicated above and below for $Sp^a$, particularly preferably $-(CH_2)_{p1}-$, $-(CH_2)_{p1}-O-$, $—(CH_2)_{p1}—CO—O—$ or $—(CH_2)_{p1}—O—CO—O—$, in which p1 is an integer from 1 to 12, where the linking to the adjacent ring in the last-mentioned groups takes place via the O atom, where, in addition, one or more of the radicals $P^1$-$Sp^1$- and $P^2$-$Sp^2$- may denote a radical $R^{aa}$, with the proviso that at least one of the radicals $P^1$-$Sp^1$- and $P^2$-$Sp^2$- present does not denote $R^{aa}$, $R^{aa}$ denotes H, F, Cl, CN or straight-chain or branched alkyl having 1 to 25 C atoms, in which, in addition, one or more non-adjacent $CH_2$ groups may each be replaced, independently of one another, by $C(R^0)═C(R^{00})—$, —C≡C—, $—N(R^0)—$, —O—, —S—, —CO—, —CO—O—, —O—CO—, or —O—CO—O— in such a way that O and/or S atoms are not linked directly to one another, and in which, in addition, one or more H atoms may each be replaced by F, Cl, CN or $P^1$-$Sp^1$-, particularly preferably straight-chain or branched, optionally mono- or polyfluorinated alkyl, alkoxy, alkenyl, alkynyl, alkylcarbonyl, alkoxycarbonyl or alkylcarbonyloxy having 1 to 12 C atoms (where the alkenyl and alkynyl radicals have at least two C atoms and the branched radicals have at least three C atoms), $R^0$, $R^{00}$ each, independently of one another and on each occurrence identically or differently, denote H or alkyl having 1 to 12 C atoms, $Z^1$ denotes —O—, —CO—, $—C(R^yR^z)—$ or $—CF_2CF_2—$, $R^y$ and $R^z$ each, independently of one another, denote H, F, $CH_3$ or $CF_3$, $Z^2$ and $Z^3$ each, independently of one another, denote —CO—O—, —O—CO—, $—CH_2O—$, $—OCH_2—$, $—CF_2O—$, $—OCF_2—$ or $—(CH_2)_n—$, where n is 2, 3 or 4, L on each occurrence, identically or differently, denotes F, Cl, CN, SCN, $SF_5$ or straight-chain or branched, optionally mono- or polyfluorinated alkyl, alkoxy, alkenyl, alkynyl, alkylcarbonyl, alkoxycarbonyl, alkylcarbonyloxy or alkoxycarbonyloxy having 1 to 12 C atoms, preferably F, L' and L" each, independently of one another, denote H, F or Cl, r denotes 0, 1, 2, 3 or 4, s denotes 0, 1, 2 or 3, t denotes 0, 1 or 2, x denotes 0 or 1.

Particular preference is given to an LC medium, a light modulation element, a process or the use as described above and below in which the LC medium or the polymerizable or polymerized component present therein does not comprise any compounds of the following formula:

M

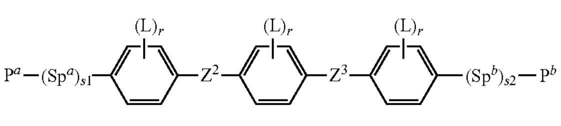

in which $P^a$, $P^b$, $Sp^a$, $Sp^b$, s1, s2 and L have the meanings indicated above and below, r denotes 0, 1, 2, 3 or 4, and $Z^2$ and $Z^3$ each, independently of one another, denote —(CO)O— or —O(CO)—.

Suitable and preferred comonomers for the LC medium according to the invention are selected, for example, from monoreactive compounds, preferably in an amount of 1 to 9%, particularly preferably 4 to 7%. Preferred monoreactive compounds are those of the formulae M1 to M29 in which one or more of the radicals $P^1$-$Sp^1$- and $P^2$-$Sp^2$- denote a radical $R^{aa}$, meaning that only one reactive group is present.

The compounds of the formula M1 to M29 and subformulae thereof can be prepared analogously to processes known to the person skilled in the art and described in standard works of organic chemistry, such as, for example, in Houben-Weyl, Methoden der organischen Chemie [Methods of Organic Chemistry], Thieme-Verlag, Stuttgart.

For the production of light modulation elements according to the invention, the polymerizable compounds are polymerized or crosslinked (if one compound contains two or more polymerizable groups) by in-situ polymerization in the LC medium between the substrates of the LC light modulation element with application of a voltage. The polymerization can be carried out in one step. It is also possible firstly to carry out the polymerization with application of a voltage in a first step in order to generate a pretilt angle, and subsequently, in a second polymerization step without an applied voltage, to polymerize or crosslink the compounds, which have not reacted in the first step ("end curing").

Suitable and preferred polymerization methods are, for example, thermal or photopolymerization, preferably photopolymerization, in particular UV photopolymerization. One or more initiators can optionally also be added here. Suitable conditions for the polymerization and suitable types and amounts of initiators are known to the person skilled in the art and are described in the literature. Suitable for free-radical polymerization are, for example, the commercially available photoinitiators from the Irgacure® series (Ciba AG), such as Irgacure651®, Irgacure184®, Irgacure907®, Irgacure369® or Darocure 1173® (Ciba AG). If an initiator is employed, its proportion is preferably 0.001 to 5% by weight, particularly preferably 0.001 to 1% by weight.

The polymerizable compounds of formula I are also suitable for polymerization without an initiator, which is accompanied by considerable advantages, such as, for example, lower material costs and in particular less contamination of the LC medium by possible residual amounts of the initiator or degradation products thereof. The polymerization can thus also be carried out without the addition of an initiator. In a preferred embodiment, the LC medium thus comprises no polymerization initiator.

Particularly preferred LC media for use in light modulation elements according to the present invention are described below and preferably comprise:

>5%, preferably >7%, more preferably >9, especially 15%, but not more than 30% of the polymerizable compounds, >5%, preferably >7%, more preferably >9, especially 15%, but not more than 30% of the polymerizable compounds of the formula I mentioned above or subformulae thereof, one, two or three polymerizable compounds of the formula I or sub-formulae thereof according to the invention, a polymerizable component which comprises exclusively polymerizable compounds of the formula I or subformulae thereof according to the invention, a polymerizable and/or liquid-crystalline component which comprises exclusively achiral compounds, a polymerizable component which comprises one or more polymerizable compounds containing one polymerizable group (monoreactive) and one or more polymerizable compounds according to the invention containing two or more, preferably two, polymerizable groups (di- or multireactive), preferably selected from compounds of the formula I or sub-formulae thereof, and optionally from the above-mentioned comonomers selected from the list comprising the formulae M1-M29, a polymerizable component which comprises exclusively polymerizable compounds according to the invention containing two polymerizable groups (direactive), preferably selected from compounds of the formula I or sub-formulae thereof, and optionally additionally from the above-mentioned co-monomers from the list comprising the formulae M1-M29, 1 to 5, preferably 1, 2 or 3, polymerizable compounds, preferably selected from polymerizable compounds according to the invention, in particular of the formula I or sub-formulae thereof.

In a preferred embodiment, the LC media according to the present invention comprises beside the polymerizable component additionally one or more unpolymerizable LC compounds, which form the liquid crystalline component of the LC medium that has preferably a nematic liquid-crystal phase.

The liquid-crystalline component according to the present invention consists of several compounds, preferably of 2 to 30, more preferably of 3 to 20 and most preferably of 4 to 16 compounds. These compounds are mixed in conventional way.

Preferably, the liquid crystalline component comprises one or more unpolymerizable LC compounds selected from compounds indicated below:

the medium comprises one or more dielectrically neutral compounds of the formulae II and/or III,

II

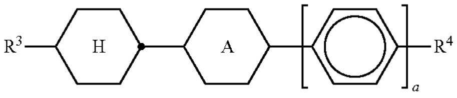

III

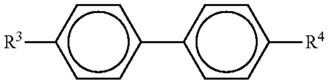

in which

A denotes 1,4-phenylene or trans-1,4-cyclohexylene, a is 0 or 1, $R^3$ denotes alkenyl having 2 to 9 C atoms, and $R^4$ denotes an alkyl or alkoxy radical having 1 to 15 C atoms, where, in addition, one or more $CH_2$ groups in these radicals may each be replaced, independently of one another, by —C≡C—, —$CF_2O$—, —CH═CH—,

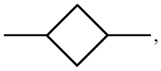, 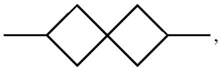,

—O—, —CO—O—, or —O—CO— in such a way that O atoms are not linked directly to one another, and in which, in addition, one or more H atoms may each be replaced by halogen, preferably alkyl having 1 to 12 C atoms or alkenyl having 2 to 9 C atoms.

The compounds of the formula II are preferably selected from the following formulae:

IIa

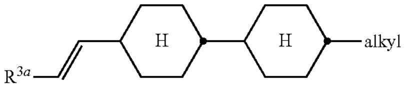

IIb

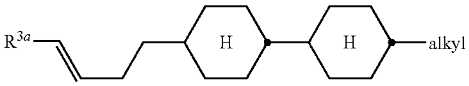

IIc

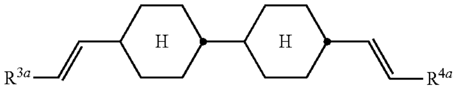

IId

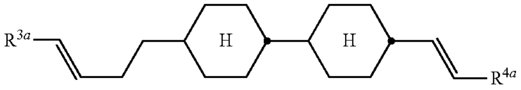

IIe

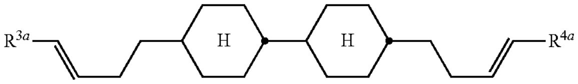

IIf

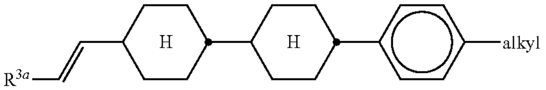

IIg

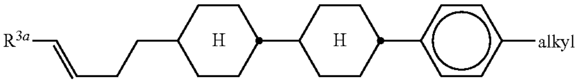

IIh

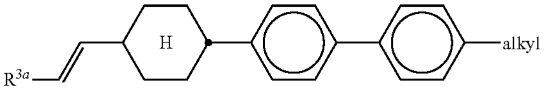

IIi

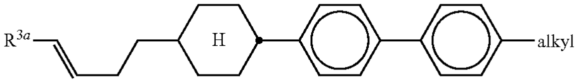

in which $R^{3a}$ and $R^{4a}$ each, independently of one another, denotes H, $CH_3$, $C_2H_5$ or $C_3H_7$, and "alkyl" denotes a straight-chain alkyl group having 1 to 8 C atoms. Particular preference is given to compounds of the formulae IIa and IIf, in particular, in which $R^{3a}$ denotes H or $CH_3$, and compounds of the formula IIc, in particular in which $R^{3a}$ and $R^{4a}$ denote H, $CH_3$ or $C_2H_5$.

Preference is furthermore given to compounds of the formula II which have a non-terminal double bond in the alkenyl side chain:

IIj

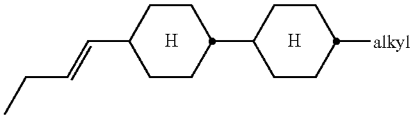

-continued
IIk
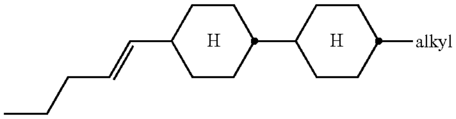
IIl
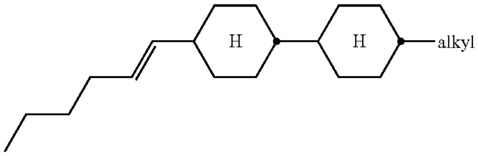
IIm
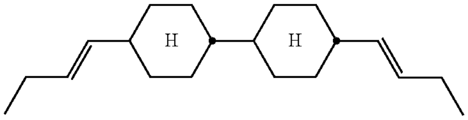
IIn
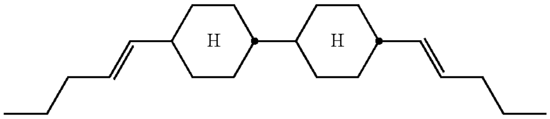
IIo
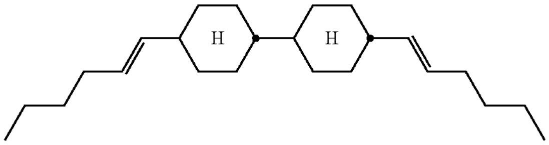
IIp
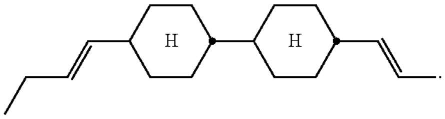
Very particularly preferred compounds of the formula II are the compounds of the formulae
IIa-1
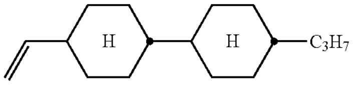
IIa-2
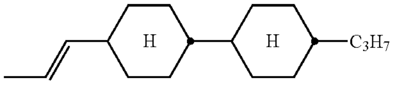
IIa-3
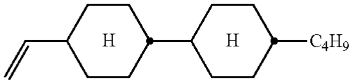
IIa-4
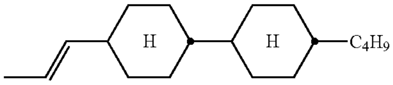
IIa-5
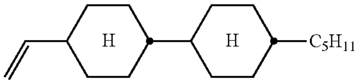
IIa-6
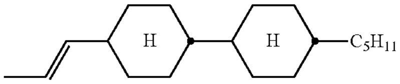
-continued
IIa-7
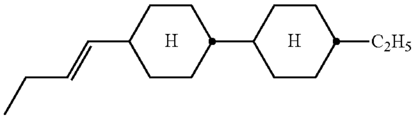
IIa-8
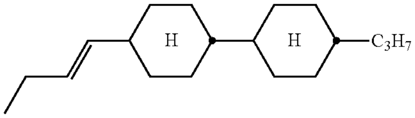
IIa-9
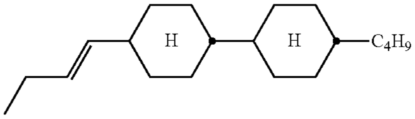
IIa-10
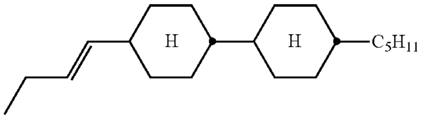
IIa-11
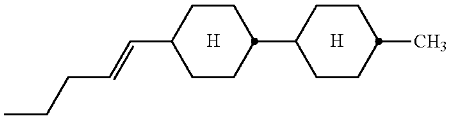
IIa-12
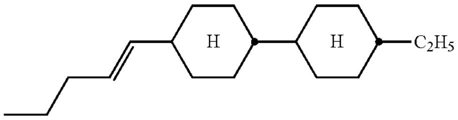
IIa-13
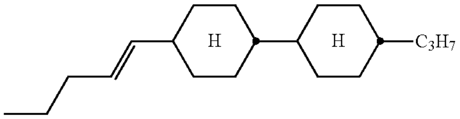
IIa-14
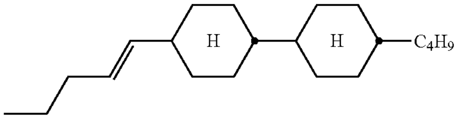
IIa-15
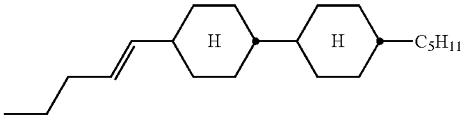
IIa-16
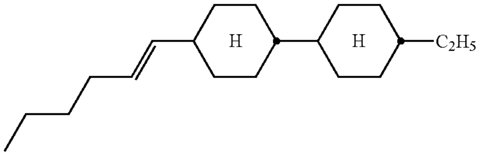
IIa-17
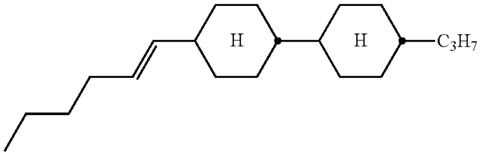

-continued

IIa-18

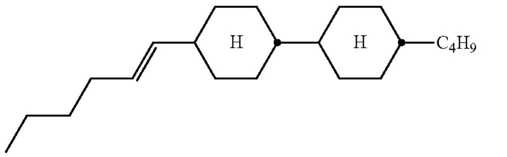

IIa-19

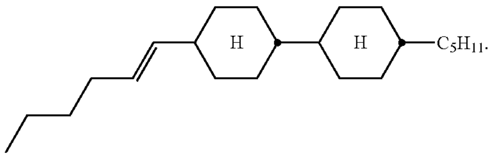

Of the compounds of the formulae IIa-1 to IIa-19, particular preference is given, in particular, to the compounds of the formulae IIa-1, IIa-2, IIa-3 and IIa-5.

Besides one or more compounds of the formula I, the liquid-crystalline component according to the invention particularly preferably comprise 5-70% by weight, in particular 10-50% by weight and very particularly preferably 15-40% by weight, of compounds of the formula

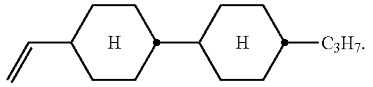

The compounds of the formula III are preferably selected from the following formulae:

IIIa

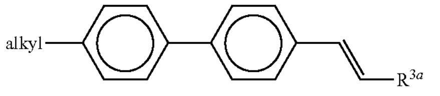

IIIb

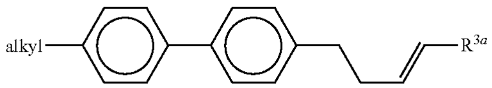

in which "alkyl" and $R^{3a}$ have the meanings indicated above, and $R^{3a}$ preferably denotes H or $CH_3$. Particular preference is given to compounds of the formula IIIb;

Very particular preference is given to the compound of the formula IIIb-1,

IIIb-1

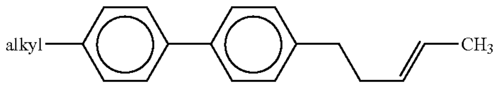

in which "alkyl" has the meaning indicated above and preferably denotes $CH_3$, furthermore $C_2H_5$ or n-$C_3H_7$.

Preferred mixtures comprise at least one compound from the group S-1, S-2, S-3 and S-4,

S-1

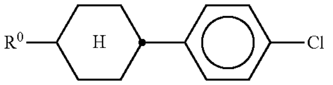

S-2

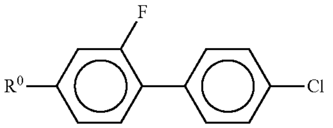

S-3

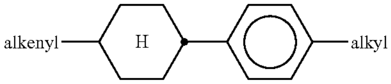

S-4

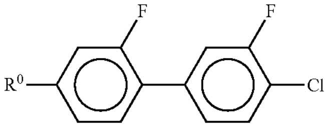

in which $R^0$ denotes H, F or straight-chain or branched alkyl having 1 to 12 C atoms, in which, in addition, one or more H atoms may each be replaced by F, alkyl denotes a straight-chain alkyl radical having 1 to 9 C atoms, preferably 2 to 6 C atoms, and alkenyl denotes a straight-chain alkenyl radical having 2-6 C atoms, since these compounds help, inter alia, to suppress the smectic phases of the mixtures.

The liquid-crystalline component preferably comprises one or more neutral compounds of the general formula N,

N

in which $R^{N1}$ and $R^{N2}$ each, independently of one another, denote an alkyl or alkoxy radical having 1 to 15 C atoms, where, in addition, one or more $CH_2$ groups in these radicals may each be replaced, independently of one another, by —C≡C—, —CH═CH—, —$CF_2$O—,

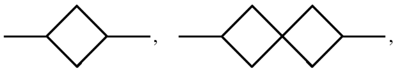

—O—, —CO—O—, or —O—CO— in such a way that O atoms are not linked directly to one another, and in which, in addition, one or more H atoms may each be replaced by halogen, rings $A^{N1}$, $A^{N2}$ and $A^{N3}$ each, independently of one another, denote 1,4-phenylene, 2-fluoro-1,4-phenylene, 3-fluoro-1,4-phenylene, trans-1,4-cyclohexylene, in which, in addition, one or two $CH_2$ groups may each be replaced by —O—, or 1,4-cyclohexenylene, $Z^{N1}$ and $Z^{N2}$ each, independently of one another, denote a single bond, —$CH_2CH_2$—, —COO—, —OCO—, —C≡C—, —$CH_2O$—, —$OCH_2$—, —$CF_2O$—, —$OCF_2$— or —CH═CH—,
n denotes 0, 1 or 2.
Preferred compounds of the formula N are shown below:
N-1
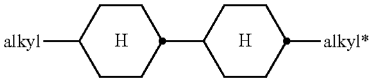
N-2
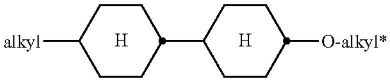
N-3
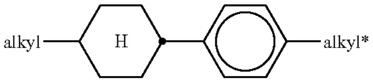
N-4
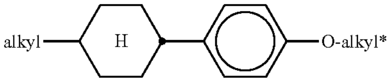
N-5
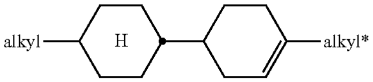
N-6
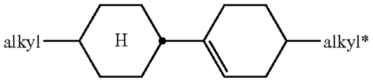
N-7
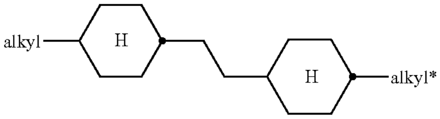
N-8
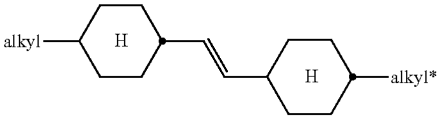
N-9
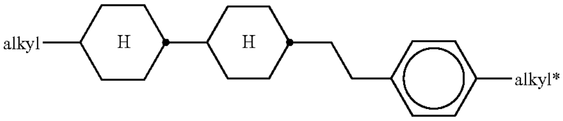
N-10
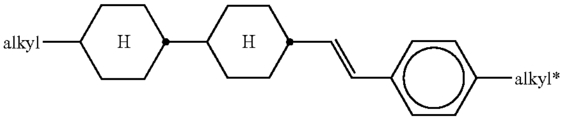
N-11
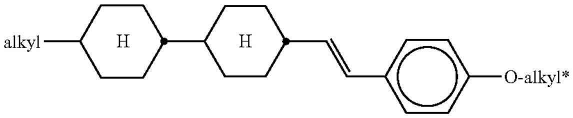
N-12
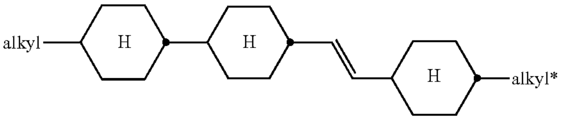
-continued
N-13
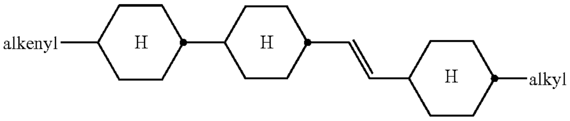
N-14
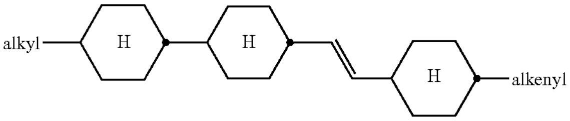
N-15
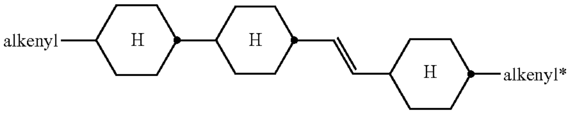
N-16
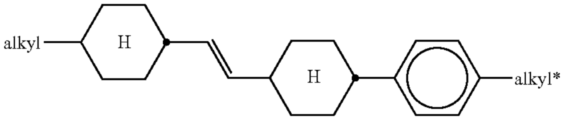
N-17
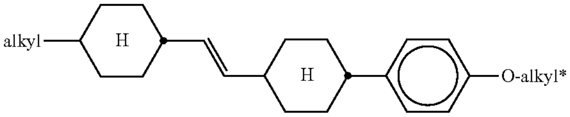
N-18
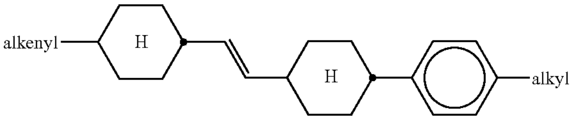
N-19
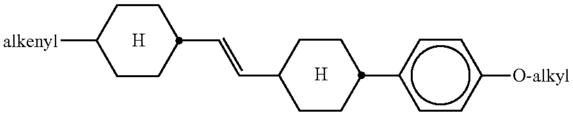
N-20
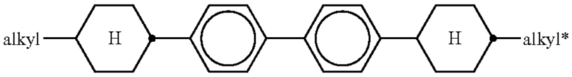
N-21
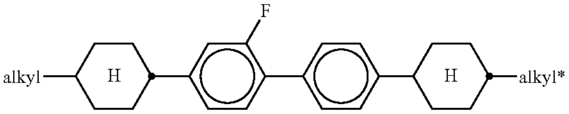
N-22
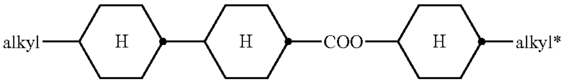
N-23
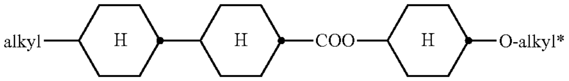

-continued

N-24

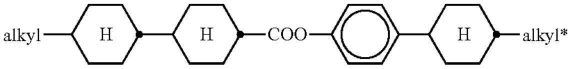

N-25

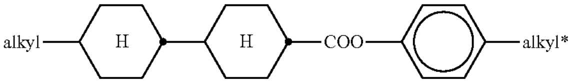

N-26

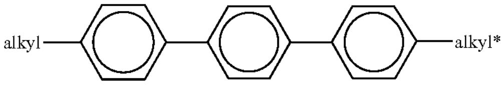

N-27

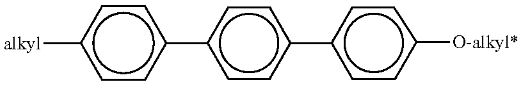

N-28

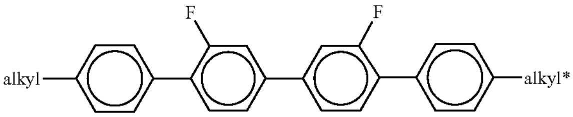

N-29

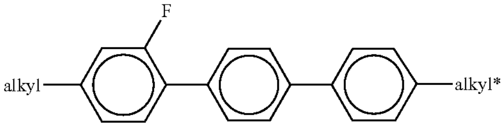

N-30

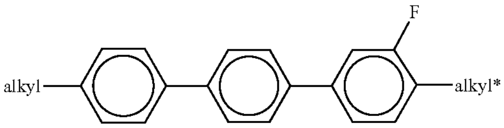

N-31

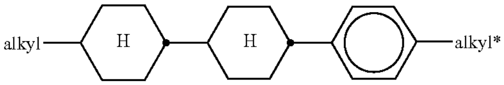

N-32

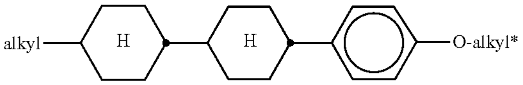

N-33

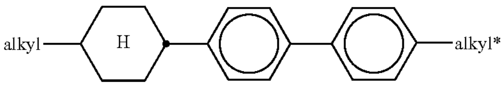

N-34

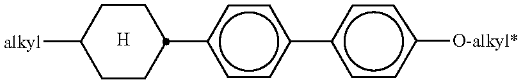

N-35

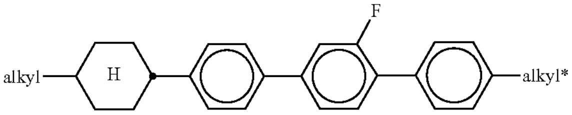

-continued

N-36

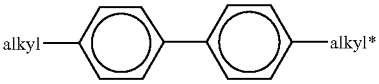

in which alkyl and alkyl* each, independently of one another, denote a straight-chain alkyl radical having 1 to 9 C atoms, preferably 2 to 6 C atoms, and alkenyl and alkenyl* each, independently of one another, denote a straight-chain alkenyl radical having 2-6 C atoms.

Of the compounds of the formula N, particular preference is given to the compounds of the formulae N-1, N-2, N-3, N-4, N-8, N-9, N-14, N-15, N-17, N-18, N-19, N-20, N-21, N-22, N-23, N-24, N-25, N-31, N-33 and N-36.

The liquid-crystalline component preferably comprises one or more compounds selected from the group of the compounds of the formulae Y-1, Y-2, Y-3 and Y-4,

Y-1

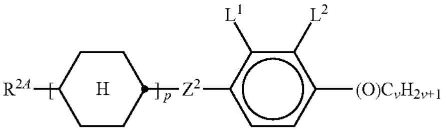

Y-2

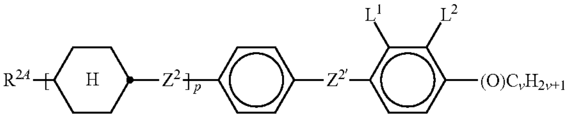

Y-3

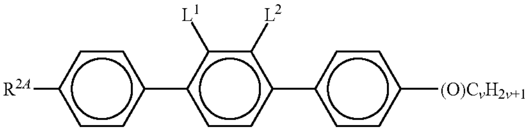

Y-4

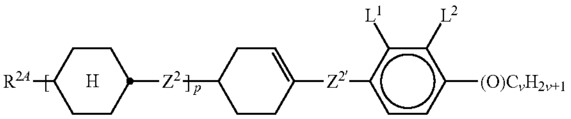

in which $R^{2A}$ denotes H, an alkyl or alkoxy radical having 1 to 15 C atoms, where, in addition, one or more $CH_2$ groups in these radicals may each be replaced, independently of one another, by —C≡C—, —$CF_2O$—, —CH═CH—,

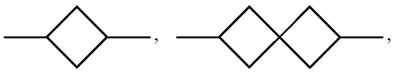

—O—, —CO—O— or —O—CO— in such a way that O atoms are not linked directly to one another, and in which, in addition, one or more H atoms may each be replaced by halogen, $L^1$ and $L^2$ each, independently of one another, denote F, Cl, $CF_3$ or $CHF_2$, preferably each denote F, $Z^2$ and $Z^{2'}$ each, independently of one another, denote a single bond, $-CH_2CH_2-$, $-CH{=}CH-$, $-CF_2O-$, $-OCF_2-$, $-CH_2O-$, $-OCH_2-$, $-COO-$, $-OCO-$, $-C_2F_4-$, $-CF{=}CF-$ or $-CH{=}CHCH_2O-$, p denotes 0, 1 or 2, q denotes 0 or 1, $(O)C_vH_{2v+1}$ denotes $OC_vH_{2v+1}$ or $C_vH_{2v+1}$, and v denotes 1 to 9, preferably 1 to 6.

Particularly preferred compounds of the formulae Y-1 to Y-4 are shown below:

Y-1a

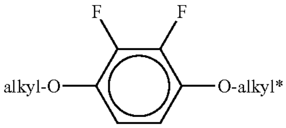

Y-1b

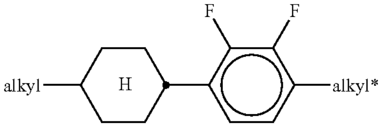

Y-1c

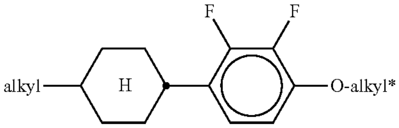

Y-1d

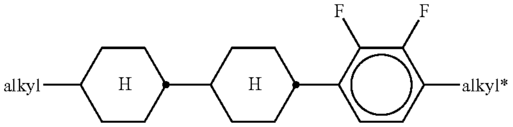

Y-1e

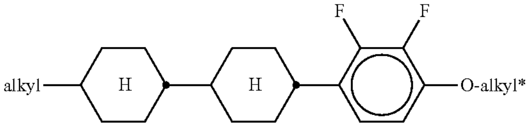

Y-1f

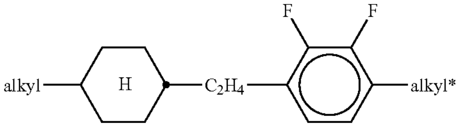

Y-1g

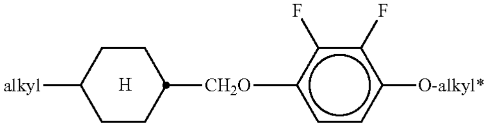

Y-1h

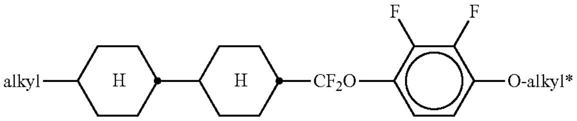

Y-1i

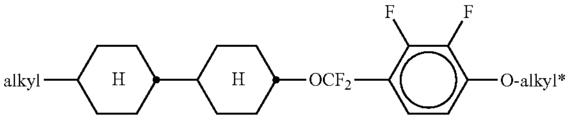

-continued

Y-1j

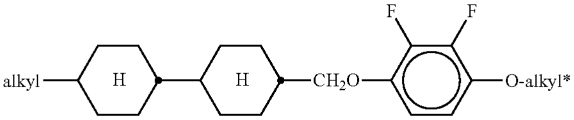

Y-1k

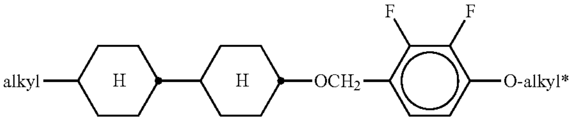

Y-1l

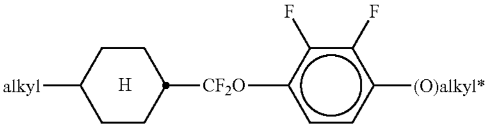

Y-1m

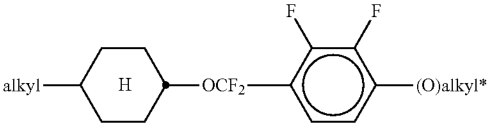

Y-1n

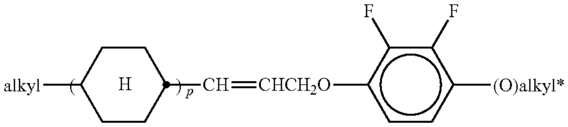

Y-1o

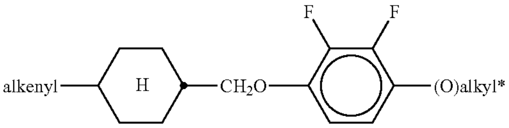

Y-1p

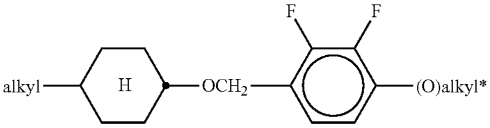

Y-1q

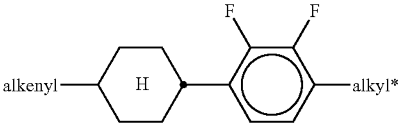

Y-1r

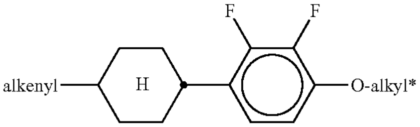

Y-1s

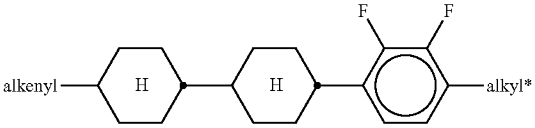

-continued

Y-1t

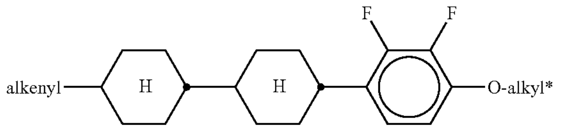

Y-1u

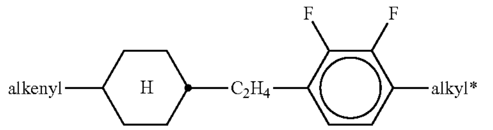

Y-1v

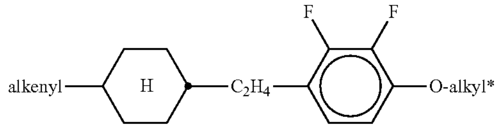

Y-2a

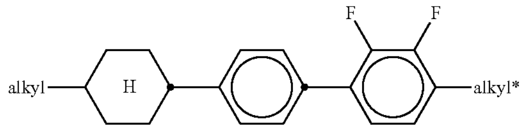

Y-2b

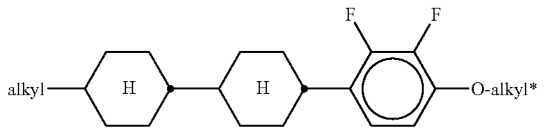

Y-2c

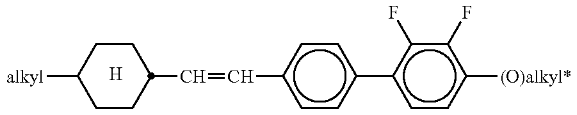

Y-2d

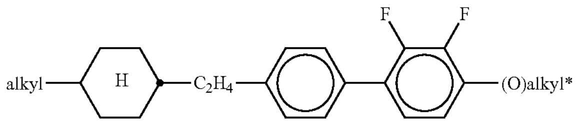

Y-2e

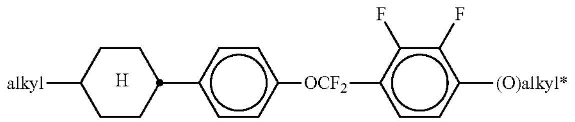

Y-2f

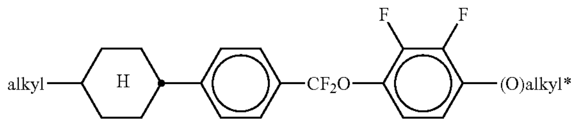

Y-2g

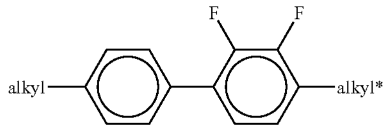

-continued

Y-2h

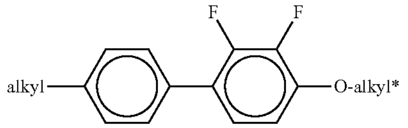

Y-2i

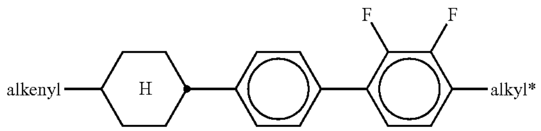

Y-2j

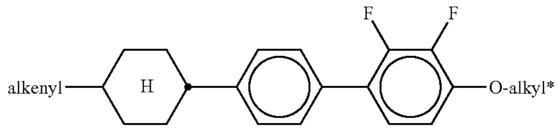

Y-3a

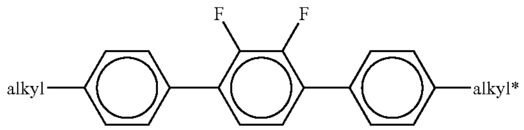

in which alkyl and alkyl* each, independently of one another, denote a straight-chain alkyl radical having 1 to 9 C atoms, preferably 2 to 6 C atoms, and alkenyl and alkenyl* each, independently of one another, denote a straight-chain alkenyl radical having 2-6 C atoms and (O) denotes —O— or a single bond.

Of the said compounds, particular preference is given to the compounds of the formulae Y-1a, Y-1c, Y-1e, Y-1g, Y-1j, Y-1r, Y-1t, Y-2b, Y-2h, Y-2j and Y-3a.

The compounds of the formulae II, III, N and Y-1 to Y-4 and sub-formulae thereof can be prepared analogously to processes known to the person skilled in the art and described in standard works of organic chemistry, such as, for example, in Houben-Weyl, Methoden der organischen Chemie [Methods of Organic Chemistry], Thieme-Verlag, Stuttgart.

Other mesogenic compounds which are not mentioned explicitly above can also optionally and advantageously be used in the LC media in accordance with the present invention. Such compounds are known to the person skilled in the art.

In a preferred embodiment, the liquid-crystalline component according to the invention having negative dielectric anisotropy are characterized by optical anisotropy values as high as possible. The birefringence values are preferably in the range from 0.065 or more to 0.300 or less, more preferably in the range from 0.090 or more to 0.250 or less, especially in the range from 0.095 or more to 0.200 or less, in particular in the range from 0.100 or more to 0.175 or less.

Preferably, the liquid-crystalline component according to the invention having negative dielectric anisotropy are characterized by relatively high values of the modulus of the dielectric anisotropy ($|\Delta\varepsilon|$), preferably as high as possible. In a preferred embodiment, values of the modulus of the dielectric anisotropy ($|\Delta\varepsilon|$) are preferably in the range from 1.0 or more to 10 or less, preferably from 2 or more to 8 or less, particularly preferably from 3 or more to 7 or less and very particularly preferably from 4 or more to 6 or less.

The nematic phase of the liquid-crystalline component according to the invention preferably extends at least from 0° C. or below to 70° C. or above, more preferably at least from −20° C. or below to 75° C. or above, very preferably at least from −30° C. or below to 75° C. or above and in particular at least from −40° C. or below to 80° C. or above.

Preferably, the liquid-crystalline component according to the present invention are characterized by relatively high values for the elastic constant K11, preferably as high as possible. In a preferred embodiment, the elastic constant K11 is approximately 10 pN or more, more preferably approximately 12 pN or more.

The liquid-crystalline component according to the present invention preferably have an elastic constant K33 of approximately 30 pN or less, more preferably of approximately 20 pN or less.

The rotational viscosity of the liquid-crystalline component is preferably as low as possible. Typically, the media according to the present invention, exhibit a rotational viscosity of approximately 400 mPas or less, preferably of approximately 300 mPas or less.

The optimum mixing ratio of the compounds of the above-mentioned formulae depends substantially on the desired properties, on the choice of the components of the above-mentioned formulae and on the choice of any further components that may be present.

The total amount of compounds of the above-mentioned formulae in the liquid-crystalline component according to the invention is not crucial. The liquid-crystalline component may therefore comprise one or more further components for the purposes of optimization of various properties.

Preferred compounds which, besides one, two or more compounds of the formula I, can be employed in a liquid-crystalline medium according to the invention having negative dielectric anisotropy are indicated below:

- the medium preferably comprises one or more compounds of the formula II, preferably selected from the group of the compounds of the formulae CC-n-V and CC-n-Vm, preferably CC-3-V, CC-3-V1, CC-4-V and CC-5-V, particularly preferably selected from the group of the compounds CC-3-V, CC-3-V1 and CC-4-V, very particularly preferably the compound CC-3-V, and optionally additionally the compound CC-4-V and/or CC-3-V1,
- the medium preferably comprises the compound PP-1-2V1,
- the medium preferably comprises one or more compounds of the formula Y-1, preferably of the formula Y-1c, selected from the group of the compounds of the formulae CY-3-O2, CY-3-O4, CY-5-O2 and CY-5-O4,
- the medium preferably comprises one or more compounds of the formula Y-1, preferably selected from the group of the compounds of the formulae Y-1e and Y-1d, preferably of the formula CCY-n-Om, preferably selected from the group of the compounds of the formulae CCY-3-O2, CCY-2-O2, CCY-3-O1, CCY-3-O3, CCY-4-O2, CCY-3-O2 and CCY-5-O2,
- the medium preferably comprises one or more compounds of the formula Y-2, preferably of the formula Y-2b, preferably selected from the group of the compounds of the formulae CPY-2-O2, CPY-3-O2, CPY-4-O2 and CPY-5-O2,
- the medium preferably comprises one or more compounds of the formula Y-2h, preferably selected from the group of the compounds of the formulae PY-3-O2, PY-1-O4 and PY-4-O2,
- the medium preferably comprises one or more compounds of the formula Y-3, preferably selected from the group of the compounds of the formulae PYP-2-3 and PYP-2-4,
- the medium preferably optionally comprises one or more compounds of the formula Y-4, preferably of the formula CLY-n-Om, preferably selected from the group of the compounds of the formulae CLY-2-O4, CLY-3-O2 and CLY-3-O3,
- the medium preferably comprises compounds of the formulae Y-1 to Y-4 in an amount of 20 to 99% by weight in the mixture as a whole,
- the medium preferably comprises 1% by weight or more to 60% by weight or less, preferably 3% by weight or more to 50% by weight or less, particularly preferably 5% by weight or more to 45% by weight or less, of compounds of the formulae II and/or III,
- the medium preferably comprises 45% by weight or more to 80% by weight or less of compounds of the formulae Y-1 to Y-4,
- the medium preferably comprises 10% by weight or more to 40% by weight or less of compounds of the formula Y-1,
- the medium preferably comprises 10% by weight or more to 40% by weight or less of compounds of the formula Y-2,
- the medium preferably comprises 10% by weight or more to 40% by weight or less of compounds of the formula Y-3,
- the medium preferably comprises 0% by weight or more to 40% by weight or less of compounds of the formula Y-4.

Furthermore, it is possible to add to the LC media, for example, 0 to 15% by weight of pleochroic dyes, furthermore nanoparticles, conductive salts, preferably ethyldimethyldodecylammonium 4-hexoxybenzoate, tetrabutyl-ammonium tetraphenylborate or complex salts of crown ethers (cf., for example, Haller et al., Mol. Cryst. Liq. Cryst. 24, 249-258 (1973)), for improving the conductivity, or substances for modifying the dielectric anisotropy, the viscosity and/or the alignment of the nematic phases. Substances of this type are described, for example, in DE-A 22 09 127, 22 40 864, 23 21 632, 23 38 281, 24 50 088, 26 37 430 and 28 53 728.

The LC media according to the present invention preferably also comprise one or more stabilizers in order to prevent undesired spontaneous polymerization of the RMs, for example during storage or transport. Suitable types and amounts of stabilizers are known to the person skilled in the art and are described in the literature. Particularly suitable are, for example, the commercially available stabilizers from the Irganox® series (Ciba AG), such as, for example, Irganox® 1076. If stabilizers are employed, their proportion, based on the total amount of RMs or the polymerizable component, is preferably 10-10,000 ppm, particularly preferably 50-500 ppm.

The LC media according to the present invention preferably also comprise one or more dyes, preferably one or more dichroic dyes.

Preferably, the dichroic dyes are selected from the group of perylene dyes, anthrachinone dyes, and/or azo dyes.

More preferably, the dichroic dyes are selected from the group of compounds of formula D,

D

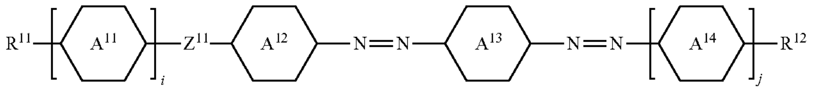

wherein,

 to 

are at each occurrence, identically or differently, selected from

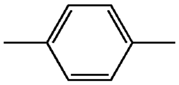, 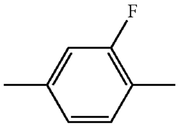, 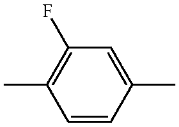, 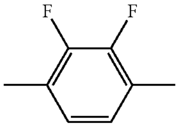, 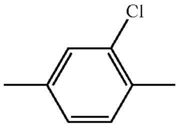, 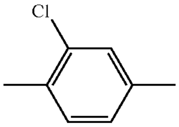, 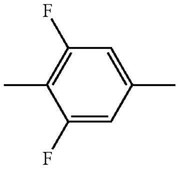, 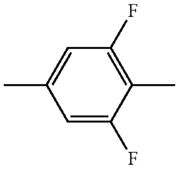 or 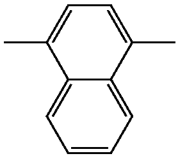, and, in case i is 2 or more, the terminal one of group

may also be

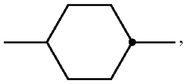, 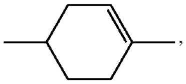, 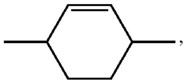, 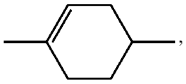, 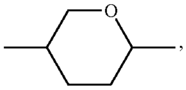, 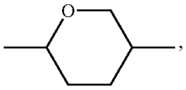, 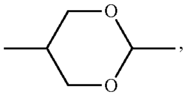, 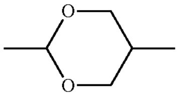 or -continued

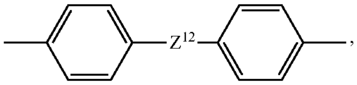, and, in case j is 2 or more, the terminal one of group

may also be

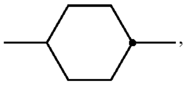, 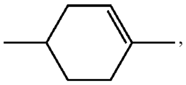, 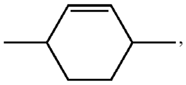, 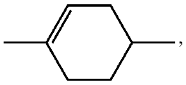, 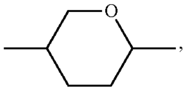, 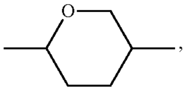, 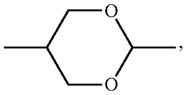, 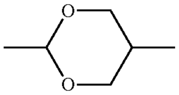, 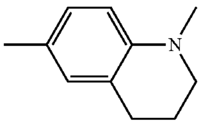 or 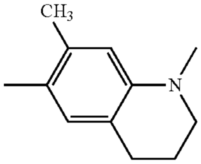, $Z^{11}$ and $Z^{12}$ are, independently of each other, —N═N—, —OCO— or —COO—, $R^{11}$ and $R^{12}$ are, independently of each other, alkyl, alkoxy, fluorinated alkyl or fluorinated alkoxy, alkenyl, alkenyloxy, alkoxyalkyl or fluorinated alkenyl, alkylaminyl, dialkylaminyl, alkylcarbonyl, alkyloxycarbonyl, alkylcarbonyloxy, alkyloxycarbonyloxy or alkylcyclohexylalkyl, and i and j are independently of each other 1, 2, 3 or 4.

In a preferred embodiment of the present invention, the liquid crystalline medium comprises one or more dichroic dyes preferably selected from the group of compounds of formulae D-1 to D-7, D-1
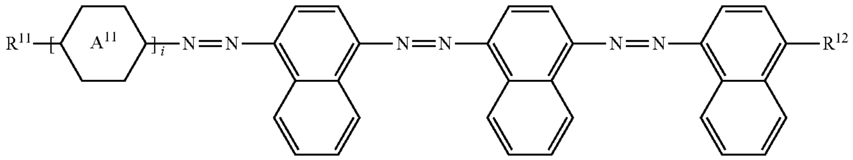
D-2
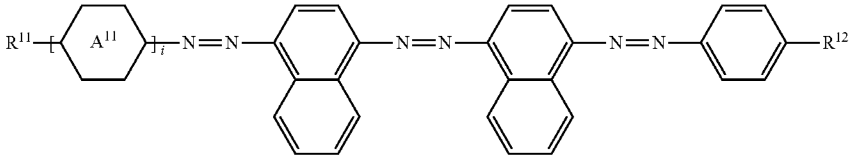
D-3
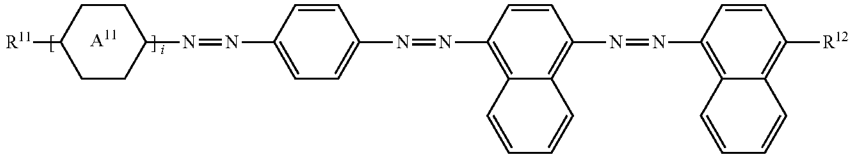
D-4
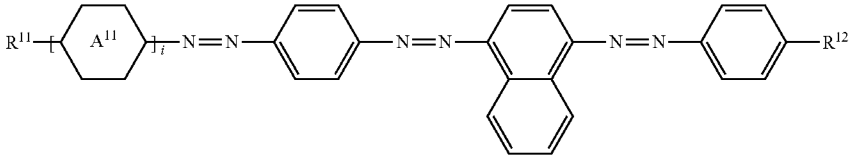
D-5
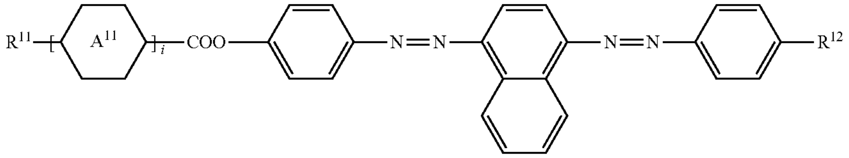
D-6
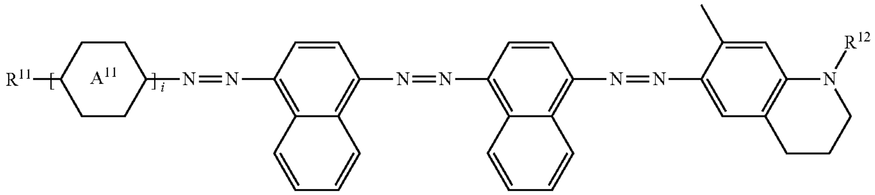
D-7
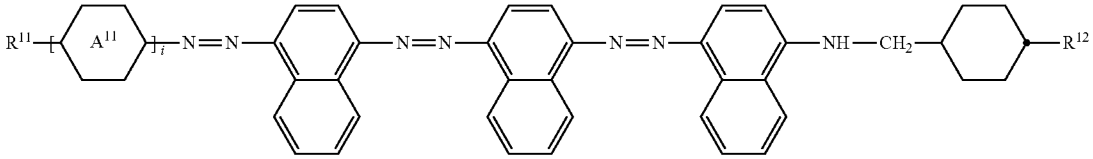
wherein the parameters have the respective meanings given under formula I above.

In a preferred embodiment of the present invention, the liquid crystalline medium comprises one or more dichroic dyes preferably selected from the group of compounds of formulae D'-1 to D'-7
D'-1
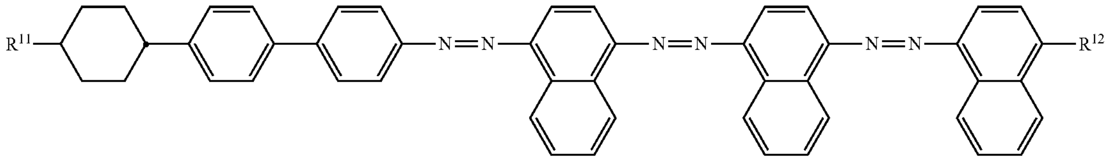
D'-2
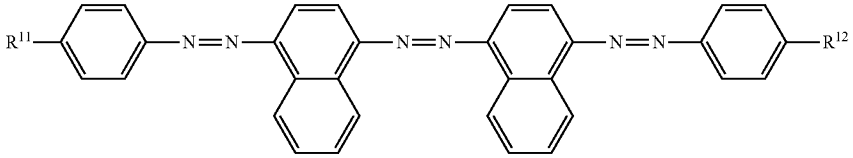
D'-3
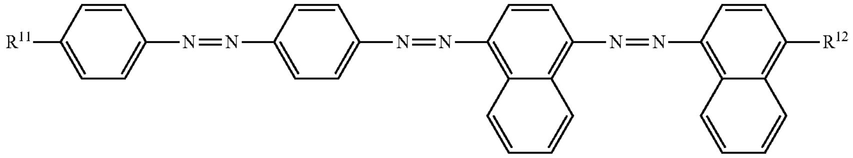
D'-4
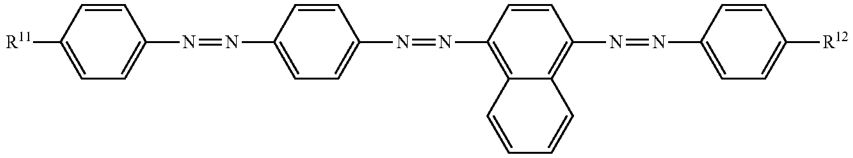
D'-5
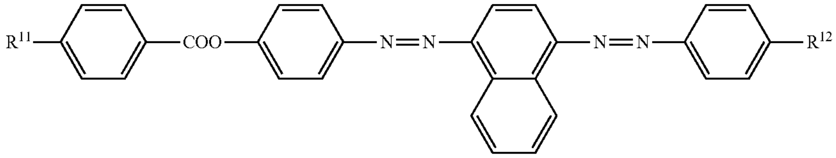
D'-6
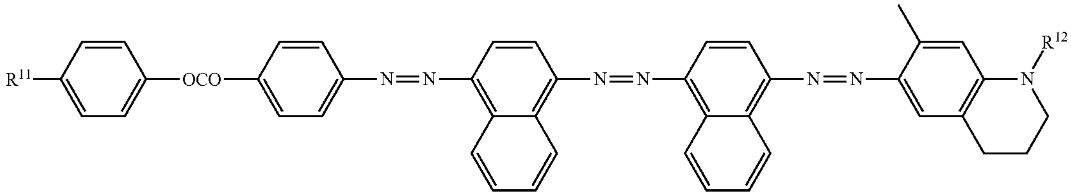
D'-7
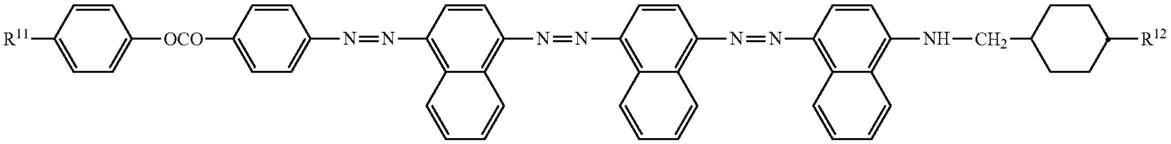
wherein the parameters have the respective meanings given under formula I above.

Further preferred compounds of formula I are represented by the following formulae D'-1a

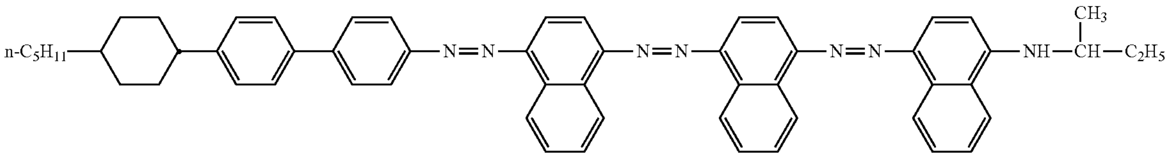

D'-4a

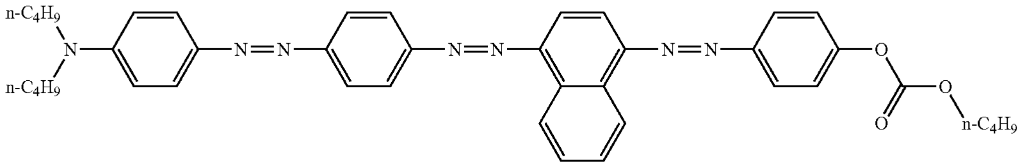

D'-5a

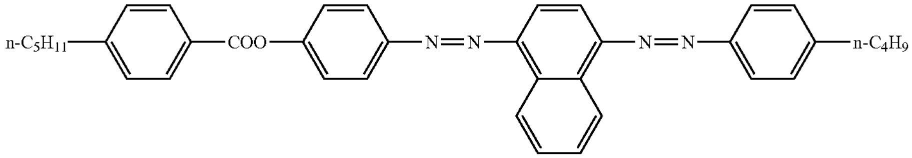

D'-6a

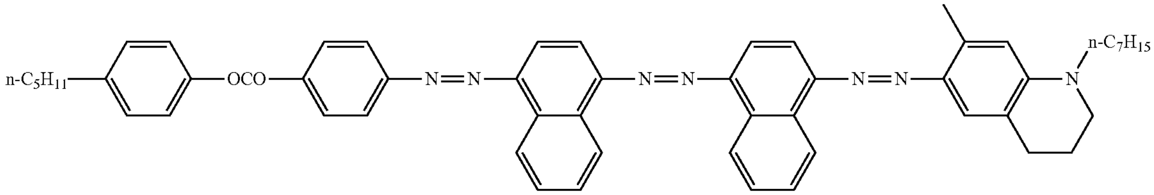

D'-7a

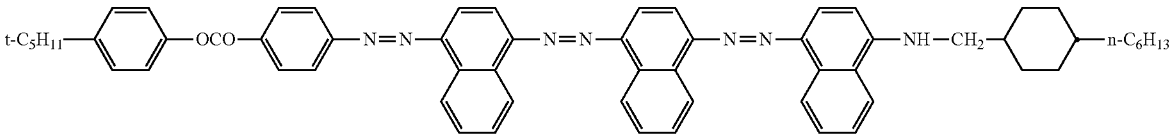

Preferably the concentration of the dichroic dyes in the medium is in the range from 0.1% to 5%, more preferably from 0.2% to 4%, even more preferably from 0.3% to 3%, most preferably from 0.5% to 2% and in particular about 1%.

In a preferred embodiment, the medium comprises a mixture of two or more, preferably of three or more dichroic dyes. Most preferably three dichroic dyes are at present. Preferably, the dichroic dyes have mutually complementing absorption spectra to each other, i. e. complementary absorption colors and are preferably mixed in a ratio relative to each other which results in a neutral color of the combined absorption of the mixture, i. e. in a black appearance. This means that the absorption is almost constant over the visible spectral range.

For example, the spectral characteristic of a preferred combination of three compounds D'-1a, D'-4a and D'-5a are given in the following table:

| | | D'-1a | D'-4a | D'-5a |
|---|---|---|---|---|
| Absorption Spectrum in $CH_2Cl_2$ (1/100,000) | | | | |
| $\lambda_{max}$ | /nm | 621 | 536 | 426 |
| $\Delta\lambda_{max}$ | /nm | ±2 | ±2 | ±2 |
| OD* | | 0.620 | 0.785 | 0.520 |
| ΔOD* | | ±0.020 | ±0.020 | ±0.020 |
| Color | | Blue | Red | Yellow (Orange) |
| Dichroic Properties | | | | |
| Host LC§ | No. ZLI- | 2903 | 2452 | |
| DR** | | 16.2 | 13.7 | 13.0 |
| S*** | | 0.83 | 0.81 | 0.80 |

*Optical Density: OD ≡ $\log_{10} (I_i/I_t)$,
Ii = Intensity of incident light,
It = Intensity of transmitted light,
§ZLI-mixtures available from Merck KGaA, Germany,
**Dichroic Ratio of Dye in Host LC and
***Order Parameter of Dye in Host LC.

The LC media according to the invention may also comprise further additives known to the person skilled in the art like for example further stabilizers, inhibitors, chain-transfer agents, isotropic co-reacting monomers, surface-active compounds, lubricating agents, wetting agents, dispersing agents, hydrophobing agents, adhesive agents, flow improvers, defoaming agents, deaerators, diluents, reactive diluents, auxiliaries, colorants, further dyes, pigments or nanoparticles in usual concentrations. Polymerizable additives are accordingly ascribed to the polymerizable component. Unpolymerizable additives are accordingly ascribed to the liquid-crystalline component.

In general, the total concentration of all compounds in the media according to this application is 100%.

It goes without saying to the person skilled in the art that the LC media according to the invention may also comprise compounds in which, for example, H, N, O, Cl, F have been replaced by the corresponding iso-topes.

The LC media according to the present invention are prepared in a manner conventional per se, for example by mixing one or more of the above-mentioned compounds with one or more polymerizable compounds as defined above, and optionally with further liquid-crystalline compounds and/or additives. In general, the desired amount of the components used in lesser amount is dissolved in the components making up the principal constituent, advantageously at elevated temperature. It is also possible to mix solutions of the components in an organic solvent, for example in acetone, chloroform or methanol, and to remove the solvent again, for example by distillation, after thorough mixing. The invention furthermore relates to the process for the preparation of the LC media according to the invention.

In a preferred embodiment, the liquid-crystal media according to the invention having negative dielectric anisotropy are characterized by optical anisotropy values in the moderate to low region. The birefringence values are preferably in the range from 0.065 or more to 0.250 or less, particularly preferably in the range from 0.090 or more to 0.200 or less and very particularly preferably in the range from 0.095 or more to 0.175 or less.

Preferably, the liquid-crystal media according, which consists preferably of the polymerizable component and the liquid-crystalline component, have relatively high values of the modulus of the dielectric anisotropy ($|\Delta\varepsilon|$), which are preferably in the range from 1.0 or more to 10 or less, preferably from 2 or more to 8 or less, particularly preferably from 3 or more to 7 or less and very particularly preferably from 4 or more to 6 or less.

The nematic phase of the media according to the invention preferably extends at least from 0° C. or below to 70° C. or above, more preferably at least from −20° C. or below to 75° C. or above, very preferably at least from −30° C. or below to 75° C. or above and in particular at least from −40° C. or below to 80° C. or above.

The invention furthermore relates to a light modulation element comprising a LC cell having two substrates and two electrodes, where at least one substrate is transparent to light and at least one substrate has one or two electrodes, and a layer, located between the substrates, of an LC medium comprising a polymerized component and a low-molecular-weight component, where the polymerized component is obtainable by polymerization of one or more polymerizable compounds between the substrates of the LC cell in the LC medium, preferably with application of an electrical voltage to the electrodes, characterized in that at least one of the polymerizable compounds is selected from formula I.

The invention furthermore relates to a process for the production of an light modulation element as described above and below in which an LC medium comprising one or more low-molecular-weight liquid-crystalline compounds or a LC host mixture as described above and below and one or more polymerizable compounds, at least one of which is selected from formula I, is introduced into an LC cell having two substrates and two electrodes as described above and below, and the polymerizable compounds are polymerized, preferably with application of an electrical voltage to the electrodes.

The light modulation elements according to the invention have two electrodes, preferably in the form of transparent layers, which are applied to one or both of the substrates which form the LC cell. Either in each case one electrode is applied to each of the two substrates, or both electrodes are applied to only one of the two substrates, while the other substrate has no electrode.

The structure of the light modulation element according to the invention, with electrode substrates and surface-treated electrode layers, corresponds to the conventional structure for displays, which is known to the person skilled in the art.

As substrate for example glass or quartz sheets or plastic films can be used. When using two substrates in case of curing by actinic radiation, at least one substrate has to be transmissive for the actinic radiation used for the polymerization.

Suitable and preferred plastic substrates are for example films of polyester such as polyethyleneterephthalate (PET) or polyethylene-naphthalate (PEN), polyvinylalcohol (PVA), polycarbonate (PC) or triacetylcellulose (TAC), very preferably PET or TAC films. As birefringent substrates for example uniaxially stretched plastics film can be used. PET films are commercially available for example from DuPont Teijin Films under the trade name Melinex®.

In a preferred embodiment, the substrates are arranged with a separation in the range from approximately 1 μm to approximately 50 μm from one another, preferably in the range from approximately 2 μm to approximately 20 μm from one another, and more preferably in the range from approximately 3 μm to approximately 10 μm from one another. The layer of the liquid-crystalline medium is thereby located in the interspace.

The substrate layers can be kept at a defined separation from one another, for example, by spacers, or projecting structures in the layer. Typical spacer materials are commonly known to the expert, as for example spacers made of plastic, silica, epoxy resins, etc.

In a further preferred embodiment of the invention, the layer of the liquid-crystalline medium is located between two flexible layers, for example flexible polymer films. The device according to the invention is consequently flexible and bendable and can be rolled up, for example. The flexible layers can represent the substrate layer, the alignment layer, and/or polarizers. Further layers, which are preferable flexible, may also, be present. For a more detailed disclosure of the preferred embodiments, in which the layer of the liquid-crystalline medium is located between flexible layers, reference is given to the application US 2010/0045924. Furthermore, electrodes and further electrical components and connections may be present in the device according to the invention in order to facilitate electrical switching of the device, comparable to the switching of an LC display. Preferably, the utilized electrode structure is capable to induce an electric field, which is perpendicular with respect to the substrate's main plane.

Thin films of ITO are commonly deposited on substrates by physical vapor deposition, electron beam evaporation, or sputter deposition techniques.

Depending on the utilized electrode structure, preferably both substrates carry patterns or layers of opposing electrodes on their facing surfaces with the intervening liquid crystal medium there between. Other, suitable electrode structures are commonly known to the expert.

Suitable electrode materials are commonly known to the expert, as for example electrodes made of metal or metal oxides, such as, for example transparent indium tin oxide (ITO), which is preferred according to the present invention.

Preferably, thin films of ITO are commonly deposited on substrates by physical vapor deposition, electron beam evaporation, or sputter deposition techniques.

Preferably, the electrodes of the light modulation element are associated with a switching element, such as a thin film transistor (TFT) or thin film diode (TFD).

In a preferred embodiment, the light modulation element comprises at least one dielectric layer, which is preferably on the electrode structure.

Typical dielectric layer materials are commonly known to the expert, such as, for example, SiOx, SiNx, Cytop, Teflon, and PMMA.

The dielectric layer materials can be applied onto the substrate or electrode layer by conventional coating techniques like spin coating, roll coating, blade coating, or vacuum deposition such as PVD or CVD. It can also be applied to the substrate or electrode layer by conventional printing techniques, which are known to the expert, like for example screen printing, offset printing, reel-to-reel printing, letterpress printing, gravure printing, rotogravure printing, flexographic printing, intaglio printing, pad printing, heat-seal printing, ink-jet printing or printing by means of a stamp or printing plate.

In a further preferred embodiment, the light modulation element comprises at least one alignment layer, which is preferably provided on the electrode layer.

The light modulation element may have further alignment layers, which are in direct contact with the layer of the liquid-crystalline medium.

Preferably, the alignment layer(s) induce(s) homeotropic alignment, preferably throughout the entire liquid-crystalline medium.

However, as commonly known to the expert, by choosing a substrate with a corresponding surface energy, it is likewise possible to induce homeotropic alignment to the liquid-crystalline medium without utilizing a special alignment layer.

The alignment layers may also serve as substrate layers, so that substrate layers are not necessary in the light modulation element. If substrate layers are additionally present, the alignment layers are in each case arranged between the substrate layer and the layer of the liquid-crystalline medium. Typical alignment layer materials are commonly known to the expert. Suitable methods to achieve homeotropic alignment are described, for example, in J. Cognard, Mol. Cryst. Liq. Cryst. 78, Supplement 1, 1-77 (1981).

It is likewise possible that a homeotropically alignment can be achieved by adding to the liquid-crystalline medium one or more so called "self-alignment agents". Suitable self-alignment agents are, for example, described by Shie-Chang Jeng et al. Optics Letters (2009), 34, 455-457 or Shug-June Hwang et al. J. Phys D. Appl. Phys 2009, 42, 025102 or the self-alignment agents disclosed in US 2008/0198301, JP 2010-170090 A, EP 2 593 529 A1 or EP 2 606 101 A1.

The alignment layer materials can be applied onto the substrate array or electrode structure by conventional coating techniques like spin coating, roll coating, dip coating or blade coating. It can also be applied by vapor deposition or conventional printing techniques, which are known to the expert, like for example screen printing, offset printing, reel-to-reel printing, letterpress printing, gravure printing, rotogravure printing, flexographic printing, intaglio printing, pad printing, heat-seal printing, ink-jet printing or printing by means of a stamp or printing plate.

It is likewise possible in accordance with the present invention and advantageous under certain conditions for the light modulation element to comprise no alignment layers adjacent to the layer of the liquid-crystalline medium.

The device may furthermore comprise filters which block light of certain wavelengths, for example UV filters. In accordance with the invention, further functional layers, such as, for example, protective films, heat-insulation films or metal-oxide layers, may also be present.

The functional principle of the light modulation element according to the invention will be explained in detail below. It is noted that no restriction of the scope of the claimed invention, which is not present in the claims, is to be derived from the comments on the assumed way of functioning.

The light transmission of the device according to the invention is dependent on the applied electric field. In a preferred embodiment, the light transmission of the device is high in the initial state when no electric field is applied and preferably, gradually decreases when an electric field is applied.

In a preferred embodiment, the device according to the invention has a boundary state A and a boundary state B.

The light modulation element preferably has the boundary state A with a transmission $T_A$ when no electrical field is applied, the so called "off state" or transparent state.

The light modulation element preferably has another boundary state B when an electric field is applied, the so called "on state" or opaque state, in which the liquid crystal medium is increasingly distorted away from the vertical, whereby $$T_A > T_B.$$

In a preferred embodiment, a large proportion of the liquid-crystalline compounds are aligned vertically to the substrate surface (homeotropic alignment). With increasing electric field, the director of LC medium is changed.

The required applied electric field strength is mainly dependent on the electrode gap and the modulus of $\Delta\varepsilon$ of the LC mixture. The applied electric field strengths are typically lower than approximately 50 V/$\mu$m$^{-1}$, preferably lower than approximately 30 V/$\mu$m$^{-1}$ and more preferably lower than approximately 25 V/$\mu$m$^{-1}$. In particular, the applied electric field strengths are in the range from 4V/$\mu$m$^{-1}$ to 20V/$\mu$m$^{-1}$.

Preferably, the applied driving voltage in order to switch the light modulation element should be as low as possible. Typically, the applied driving voltage is in the range from 2 V to approximately 200 V, more preferably in the range from approximately 3 V to approximately 100 V, and even more preferably in the range from approximately 5 V to approximately 50 V.

A typical process of preparing a liquid crystal light modulation element according to the present invention comprises at least the steps of

- cutting and cleaning of the substrates,
- providing electrode structure on each of the substrates,
- optionally coating of a dielectric layer on the electrode structure, optionally providing an alignment layer on the electrode structure, assembling the cell using an adhesive (UV or heat curable) with spacer, filling the cell with the LC medium, and exposing the LC medium to actinic radiation that induces photopolymerization of the polymerizable compounds.

In the first step the LC medium, as described above and below, is provided as a layer between two substrates forming a cell. Typically, the liquid crystal medium is filled into the cell. Conventional filling methods can be used which are known to the skilled person, like for example the so-called "one-drop filling" (ODF). Likewise also other commonly known methods can be utilized, such as, for example, vacuum injection method or inkjet printing method (IJP)

In the irradiation step, the light modulation element is exposed to actinic radiation that causes photopolymerization of the polymerizable functional groups of the polymerizable compounds contained in the cholesteric liquid crystal medium. Polymerization is achieved for example by exposing the polymerizable material to heat or actinic radiation. Actinic radiation means irradiation with light, like UV light, IR light or visible light, irradiation with X-rays or gamma rays or irradiation with high-energy particles, such as ions or electrons. Preferably, polymerization is carried out by UV irradiation. As a source for actinic radiation, for example a single UV lamp or a set of UV lamps can be used. Another possible source for actinic radiation is a laser, like for example a UV, IR or visible laser.

Because of the irradiation the polymerizable compounds are substantially polymerized or crosslinked (in case of compounds with two or more polymerizable groups) in situ within the liquid crystal medium between the substrates forming the light modulation element.

The wavelength of the actinic radiation should not be too low, in order to avoid damage to the LC molecules of the medium, and should preferably be different from, very preferably higher than, the UV absorption maximum of the LC host mixture. On the other hand, the wavelength of the photo radiation should not be too high, to allow quick and complete UV photopolymerization of the RMs, and should be not higher than, preferably the same as or lower than the UV absorption maximum of the polymerizable component.

Suitable wavelengths are preferably selected from 300 to 400 nm, for example 340 nm or more, preferably 350 nm or more, more preferably 360 nm or more.

The irradiation or exposure time should be selected such that polymerization is as complete as possible, but still not be too high to allow a smooth production process. Also, the radiation intensity should be high enough to allow quick and complete polymerization as possible, but should not be too high to avoid damage to the cholesteric liquid crystal medium.

The curing time depends, inter alia, on the reactivity of the polymerizable material, the thickness of the coated layer, the type of polymerization initiator and the power of the UV lamp. The curing time is preferably ≤10 minutes, very preferably ≤5 minutes, most preferably ≤3 minutes. In general, for mass production shorter curing times are preferred, such as approximately 200 seconds to 10 seconds.

A suitable UV radiation power is preferably in the range from 5 to 250 $mWcm^{-2}$, more preferably in the range from 6 to 200 $mWcm^{-2}$, especially in the range from 7 to 200 $mWcm^{-2}$, and in particular 10 to 200 $mWcm^{-2}$.

In connection with the applied UV radiation and as a function of time, a suitable UV dose is preferably in the range from 500 to 7200 $mJcm^{-2}$ more preferably in the range from 1000 to 5000 $mJcm^{-2}$ and most preferably in the range from 1250 to 2500 $mJcm^{-2}$.

The light modulation element of the present invention can be used in various types of optical and electro-optical devices.

Said optical and electro optical devices include, without limitation electro-optical displays, liquid crystal displays (LCDs), non-linear optic (NLO) devices, optical information storage devices, light shutters and Smart Windows, preferably as light shutters for see through OLED displays.

It will be appreciated that many of the features described above, particularly of the preferred embodiments, are inventive in their own right and not just as part of an embodiment of the present invention. Independent protection may be sought for these features in addition to, or alternative to any invention presently claimed.

It will be appreciated that variations to the foregoing embodiments of the invention can be made while still falling within the scope of the invention. Alternative features serving the same, equivalent or similar purpose may replace each feature disclosed in this specification, unless stated otherwise. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Without further elaboration, it is believed that one skilled in the art can, using the preceding description, utilize the present invention to its fullest extent. The following examples are, therefore, to be construed as merely illustrative and not limitative of the remainder of the disclosure in any way whatsoever.

The parameter ranges indicated in this application all include the limit values including the maximum permissible errors as known by the expert. The different upper and lower limit values indicated for various ranges of properties in combination with one another give rise to additional preferred ranges.

In the present application and especially in the following examples, the structures of the liquid crystal compounds are represented by abbreviations, which are also called "acronyms". The transformation of the abbreviations into the corresponding structures is straightforward according to the following three tables A to C. Table A lists the symbols used for the ring elements, table B those for the linking groups and table C those for the symbols for the left hand and the right hand end groups of the molecules.

All groups $C_nH_{2n+1}$, $C_mH_{2m+1}$, and $C_lH2_{l+1}$ are preferably straight chain alkyl groups with n, m and I C-atoms, respectively, all groups $C_nH_{2n}$, $C_mH_{2m}$ and $C_lH_{2l}$ are preferably $(CH_2)_n$, $(CH_2)_m$ and $(CH_2)_l$, respectively and —CH=CH— preferably is trans- respectively E vinylene.

TABLE A

| Ring Elements | |
|---|---|
| C | 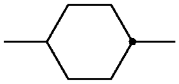 |

TABLE A-continued
| Ring Elements | |
|---|---|
| P | 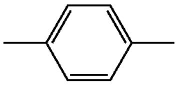 |
| D | 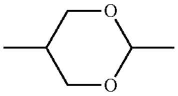 |
| DI | 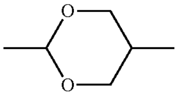 |
| A | 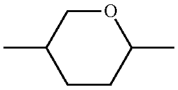 |
| AI | 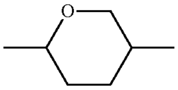 |
| G | 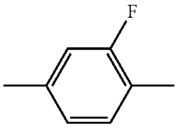 |
| GI | 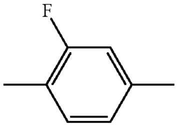 |
| U | 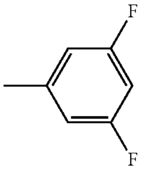 |
| UI | 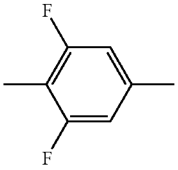 |
| Y | 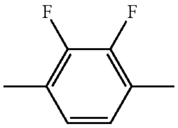 |
| M | 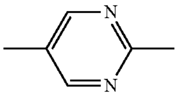 |
| MI | 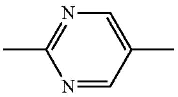 |
TABLE A-continued
| Ring Elements | |
|---|---|
| N | 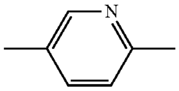 |
| NI | 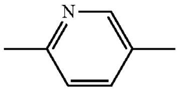 |
| np | 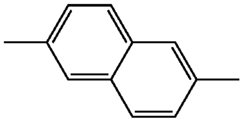 |
| n3f | 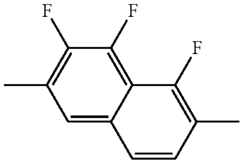 |
| n3fl | 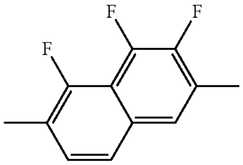 |
| th | 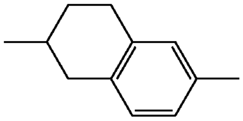 |
| thl | 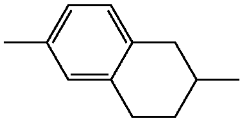 |
| th2f | 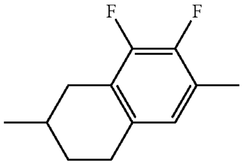 |
| th2fl | 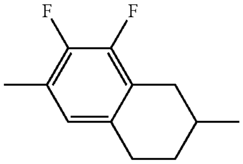 |
| o2f | 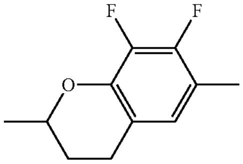 |

TABLE A-continued

| Ring Elements | |
|---|---|
| o2fl | 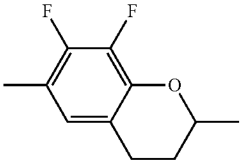 |
| dh | 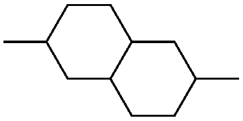 |
| K | 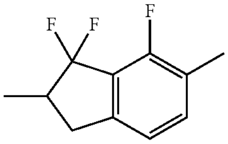 |
| KI | 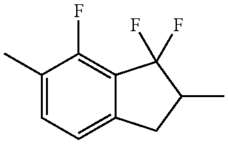 |
| L | 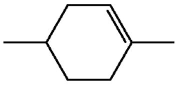 |
| LI | 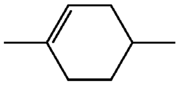 |
| F | 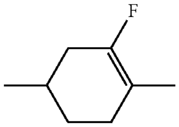 |
| FI | 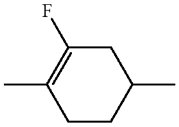 |

TABLE B

| Linking Groups | | | |
|---|---|---|---|
| E | —$CH_2$—$CH_2$— | | |
| V | —CH═CH— | | |
| T | —C≡C— | | |
| W | —$CF_2$—$CF_2$— | | |
| B | —CF═CF— | | |
| Z | —CO—O— | ZI | —O—CO— |
| X | —CF═CH— | XI | —CH═CF— |
| O | —$CH_2$—O— | OI | —O—$CH_2$— |
| Q | —$CF_2$—O— | QI | —O—$CF_2$— |

TABLE C

| End Groups | | | |
|---|---|---|---|
| Left hand side, used alone or in combination with others | | Right hand side, used alone or in combination with others | |
| n- | $C_nH_{2n+1}$— | -n | —$C_nH_{2n+1}$ |
| nO- | $C_nH_{2n+1}$—O— | -nO | —O—$C_nH_{2n+1}$ |
| V- | $CH_2$═CH— | -V | —CH═$CH_2$ |
| nV- | $C_nH_{2n+1}$—CH═CH— | -nV | —$C_nH_{2n}$—CH═$CH_2$ |
| Vn- | $CH_2$═CH—$C_nH_{2n}$— | -Vn | —CH═CH—$C_nH_{2n+1}$ |
| nVm- | $C_nH_{2n+1}$—CH═CH—$C_mH_{2m}$— | -nVm | —$C_nH_{2n}$—CH═CH—$C_mH_{2m+1}$ |
| N- | N≡C— | -N | —C≡N |
| S- | S═C═N— | -S | —N═C═S |
| F- | F— | -F | —F |
| CL- | Cl— | -CL | —Cl |
| M- | $CFH_2$— | -M | —$CFH_2$ |
| D- | $CF_2H$— | -D | —$CF_2H$ |
| T- | $CF_3$— | -T | —$CF_3$ |
| MO- | $CFH_2O$— | -OM | —$OCFH_2$ |
| DO- | $CF_2HO$— | -OD | —$OCF_2H$ |
| TO- | $CF_3O$— | -OT | —$OCF_3$ |
| A- | H—C≡C— | -A | —C≡C—H |
| nA- | $C_nH_{2n+1}$—C≡C— | -An | —C≡C—$C_nH_{2n+1}$ |
| NA- | N≡C—C≡C— | -AN | —C≡C—C≡N |
| Left hand side, used in combination with others only | | Right hand side, used in combination with others only | |
| - . . . n . . . - | —$C_nH_{2n}$— | - . . . n . . . | —$C_nH_{2n}$— |
| - . . . M . . . - | —CFH— | - . . . M . . . | —CFH— |
| - . . . D . . . - | —$CF_2$— | - . . . D . . . | —$CF_2$— |
| - . . . V . . . - | —CH═CH— | - . . . V . . . | —CH═CH— |
| - . . . Z . . . - | —CO—O— | - . . . Z . . . | —CO—O— |
| - . . . ZI . . . - | —O—CO— | - . . . ZI . . . | —O—CO— |
| - . . . K . . . - | —CO— | - . . . K . . . | —CO— |
| - . . . W . . . - | —CF═CF— | - . . . W . . . | —CF═CF— |

wherein n and m each are integers and three points " . . . " indicate a space for other symbols of this table.

EXAMPLES

LC Component

The following mixture M-1 is prepared.

| | | | |
|---|---|---|---|
| CY-3-O4 | 25.00% | T(N, I) [° C.]: | 81.0 |
| CY-5-O2 | 9.00% | $\Delta n$ [589 nm, 20° C.] | 0.153 |
| CCY-3-O2 | 7.00% | $\Delta\varepsilon$ [kHz, 20° C.]: | −5.0 |
| CCY-3-O3 | 4.50% | $\gamma_1$ [mPa · s, 20° C.]: | 298 |
| CPY-2-O2 | 10.00% | $K_1$ [20° C.]: | 13.1 |
| CPY-3-O2 | 10.00% | $K_3$ [20° C.]: | 15.9 |
| PYP-2-3 | 14.00% | $V_0$ [V]: | 1.89 |
| PYP-2-4 | 10.00% | | |
| CCP-V-1 | 3.00% | | |
| CPP-3-2 | 2.00% | | |
| PP-1-2V1 | 3.50% | | |
| PGP-2-3 | 2.00% | | |

Polymerizable Compounds

RM-1

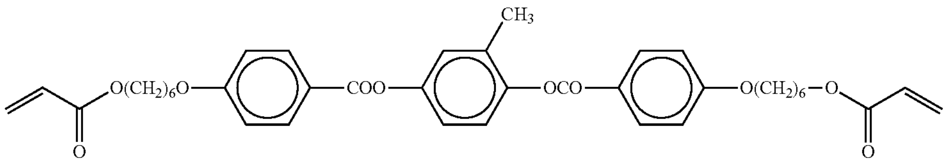

RM-2

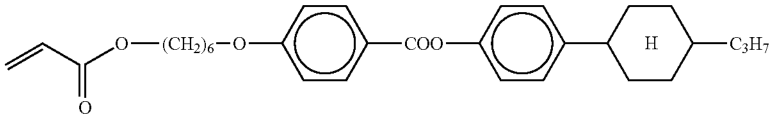

RM-3

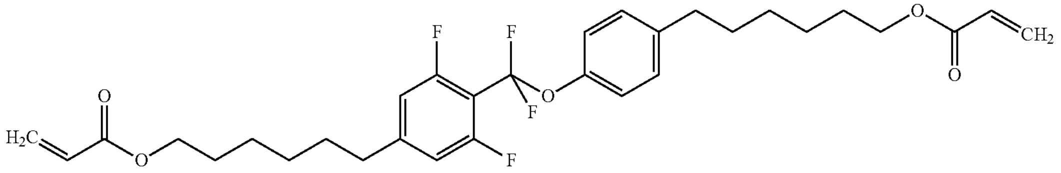

Test Cell

On an ITO coated glass substrates, a 50 nm VA-polyimide (AL60702, JSR) layer is spin coated. After drying, the test cell is assembled, while two of the above described substrates are oriented parallel to each other with a cell gap of 10 μm. The test cell is filled with the corresponding mixture as described in the following examples. The polymerizable component is then cured with in the test cell with the corresponding curing parameters as given in the following examples. A corresponding electric field as given in the following examples is applied to the test cell in order to switch from the "off state" to the opaque "on state".

Methods

The haze performance is measured depending on the applied voltage (Haze vs. Voltage) with a corresponding commonly used haze meter. $V_{op}$ is thereby the operating voltage to achieve maximum haze level.

Example 1

89.7% of mixture M1, 10.0% of RM-3, and 0.3% of Irgacure®651 (from CIBA) are mixed and filled in the test cell as given above. The cell is then exposed to UV light with Mirho UV CURE 850 (Mercuri UV lamp) with 365 band pass filter and with 200 mW for 10 s.

An electric field (35 V to 100V, 60 Hz) is applied to the test cell in order to switch from the "off state" to the opaque "on state".

The $V_{op}$ is about 35 V (10 um cell gap) and haze level is 78%.

Example 2

89.7% of mixture M1, 10.0% of RM-3, and 0.3% of Irgacure®651 (from CIBA) are mixed and filled in the test cell as given above. The cell is then exposed to UV light (Mirho UV CURE 850 (Mercuri UV lamp) with 365 band pass filter with 7.5 mW for 180 s.

An electric field of 25V and 60 Hz is applied to the test cell in order to switch from the "off state" to the opaque "on state".

The $V_{op}$ is about 25V (10 um cell gap) and haze level is 83%

Comparative Example 1

90.0% of mixture M1, 10.0% and RM-1 are mixed and filled in the test cell as given above. The cell is then exposed to UV light (Mirho UV CURE 850 (Mercuri UV lamp) with 365 band pass filter, 200 mW for 10 s).

An electric field (35 V to 100V, 60 Hz) is applied to the test cell in order to switch from the "off state" to the opaque "on state".

The $V_{op}$ is about 50 V (10 um cell gap) and haze level is 84%.

Comparative Example 2

89.55% of mixture M1, 4.975% of RM-1, 4.975% of RM-2, and Irgacure®907 (from CIBA) are mixed and filled in the test cell as given above. The cell is then exposed to UV light (Mirho UV CURE 850 (Mercuri UV lamp) with 365 band pass filter, 200 mW for 10 s).

An electric field (35 V to 100V, 60 Hz) is applied to the test cell in order to switch from the "off state" to the opaque "on state".

The $V_{op}$ is about 80 V (10 um cell gap) and haze level is 85%.

The entire disclosures of all applications, patents and publications, cited herein and of corresponding application No. EP 16158122.8, filed Mar. 1, 2017, are incorporated by reference herein.

The preceding examples can be repeated with similar success by substituting the generically or specifically described reactants and/or operating conditions of this invention for those used in the preceding examples.

From the foregoing description, one skilled in the art can easily ascertain the essential characteristics of this invention and, without departing from the spirit and scope thereof, can make various changes and modifications of the invention to adapt it to various usages and conditions.

The invention claimed is:

1. A liquid-crystalline medium, having a negative dielectric anisotropy, comprising:

one or more polymerizable compounds of formula I, $$P^a\text{-}(Sp^a)_{s1}\text{-}(A^1\text{-}Z^1)_{n1}\text{-}A^2\text{-}Q^1\text{-}A^3\text{-}(Z^4\text{-}A^4)_{n2}\text{-}(Sp^b)_{s2}\text{-}P^b \qquad I$$

in which the individual radicals have the following meanings:

$P^a$ denotes a polymerizable group, $P^b$ denotes a polymerizable group, H or F, $Sp^a$, $Sp^b$ each, independently of one another, denote a spacer group, s1, s2 each, independently of one another, denote 0 or 1, n1, n2 each, independently of one another, denote 0 or 1, $Q^1$ denotes $—CF_2O—$, $—OCF_2—$, $—CH_2O—$, $—OCH_2$, $—(CO)O—$, $—O(CO)—$, $—(CH_2)_4—$, $—CH_2CH_2—$, $—CF_2—CF_2—$, $—CF_2—CH_2—$, $—CH_2—CF_2—$, $—CH{=}CH—$, $—CF{=}CF—$, $—CF{=}CH—$, $—(CH_2)_3$ $O—$, $—O(CH_2)_3—$, $—CH{=}CF—$, $—C{\equiv}C—$, $—O—$, $—CH_2—$, $—(CH_2)_3—$, or $—CF_2—$, $Z^1$, $Z^4$ denote a single bond, $—CF_2O—$, $—OCF_2—$, $—CH_2O—$, $—OCH_2—$, $—(CO)O—$, $—O(CO)—$, $—(CH_2)_4—$, $—CH_2CH_2—$, $—CF_2—CF_2—$, $—CF_2—CH_2—$, $—CH_2—CF_2—$, $—CH{=}CH—$, $—CF{=}CF—$, $—CF{=}CH—$, $—(CH_2)_3O—$, $—O(CH_2)_3—$, $—CH{=}CF—$, $—C{\equiv}C—$, $—O—$, $—CH_2—$, $—(CH_2)_3—$, or $—CF_2—$, where $Z^1$ and $Q^1$ or $Z^2$ and $Q^1$ do not simultaneously denote a group selected from $—CF_2O—$ and $—OCF_2—$, $A^1$, $A^2$, $A^3$, $A^4$ each, independently of one another, denotes a radical selected from the following groups:

a) the group consisting of 1,4-phenylene and 1,3-phenylene, in which, in addition, one or two CH groups may each be replaced by N and in which, in addition, one or more H atoms may each be replaced by L, b) the group consisting of trans-1,4-cyclohexylene, 1,4-cyclohexenylene and 1,4'-bicyclohexylene, in which, in addition, one or more non-adjacent $CH_2$ groups may each be replaced by —O— and/or —S— and in which, in addition, one or more H atoms may each be replaced by F or Cl, c) the group consisting of tetrahydropyran-2,5-diyl, 1,3-dioxane-2,5-diyl, tetrahydrofuran-2,5-diyl, cyclobutane-1,3-diyl, piperidine-1,4-diyl, thiophene-2,5-diyl and selenophene-2,5-diyl, each of which may, in addition, be mono- or polysubstituted by L, and d) the group consisting of saturated, partially unsaturated or fully unsaturated, and optionally substituted, polycyclic radicals having 5 to 20 cyclic C atoms, one or more of which may also be replaced by heteroatoms, L denotes on each occurrence, identically or differently, F, Cl, CN, SCN, $SF_5$ or straight-chain or branched, in each case optionally fluorinated alkyl, alkoxy, alkylcarbonyl, alkoxycarbonyl, alkylcarbonyloxy or alkoxycarbonyloxy having up to 12 C atoms; and one or more compounds of formulae II and/or III,

II

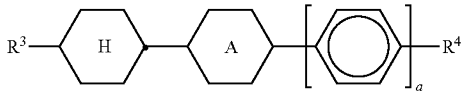

III

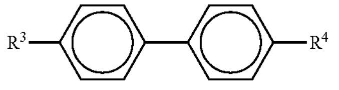

in which

A denotes 1,4-phenylene or trans-1,4-cyclohexylene, a is 0 or 1, $R^3$ denotes alkenyl having 2 to 9 C atoms, and $R^4$ denotes an alkyl or alkoxy radical having 1 to 15 C atoms, where, in addition, one or more $CH_2$ groups in these radicals may each be replaced, independently of one another, by $—C{\equiv}C—$, $—CF_2O—$, $—CH{=}CH—$,

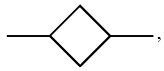,
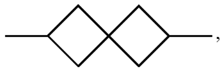,

—O—, —CO—O—, or —O—CO— in such a way that O atoms are not linked directly to one another, and in which, in addition, one or more H atoms may each be replaced by halogen.

2. A liquid-crystalline medium according to claim 1, wherein $Q^1$ in formula I denotes a group $—CF_2O—$.

3. A liquid-crystalline medium according to claim 1, wherein $A^2$ and $A^3$ in formula I, independently of one another, denote 1,4-phenylene or 1,3-phenylene, in which, in addition, one or more H atoms may each be replaced by L, and L denotes on each occurrence, identically or differently, F, Cl, CN, SCN, $SF_5$ or straight-chain or branched, in each case optionally fluorinated alkyl, alkoxy, alkylcarbonyl, alkoxycarbonyl, alkylcarbonyloxy or alkoxycarbonyloxy having up to 12 C atoms.

4. A liquid-crystalline medium according to claim 1, wherein said medium contains one or more compounds of following formula

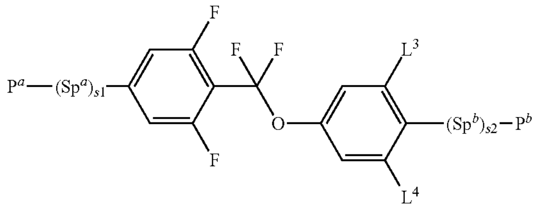

in which $P^a$, $P^b$, $Sp^a$, $Sp^b$, s1, s2 are as defined in claim 1, and $L^3$ and $L^4$, independently of one another, denote H or F.

5. A liquid-crystalline medium according to claim 1, wherein said medium additionally comprises one or more other polymerizable compounds and/or one or more unpolymerizable liquid-crystalline compounds.

6. A liquid-crystalline medium according to claim 1, wherein said medium comprises one or more compounds of formula N,

N

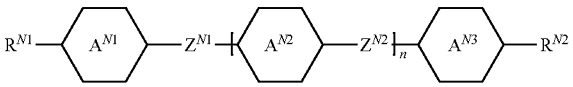

in which $R^{N1}$ and $R^{N2}$ each, independently of one another, denote an alkyl or alkoxy radical having 1 to 15 C atoms, where, in addition, one or more $CH_2$ groups in these radicals may each be replaced, independently of one another, by —C≡C—, —$CF_2O$—,

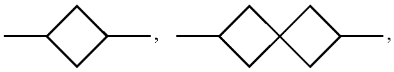

—O—, —CO—O—, or —O—CO— in such a way that O atoms are not linked directly to one another, and in which, in addition, one or more H atoms may each be replaced by halogen, $A^{N1}$, $A^{N2}$ and $A^{N3}$ each, independently of one another, denote 1,4-phenylene, 2-fluoro-1,4-phenylene, 3-fluoro-1,4-phenylene, trans-1,4-cyclohexylene, in which, in addition, one or two $CH_2$ groups may each be replaced by —O—, or 1,4-cyclohexenylene, $Z^{N1}$ and $Z^{N2}$ each, independently of one another, denote a single bond, —$CH_2CH_2$—, —COO—, —OCO—, —C≡C—, —$CH_2O$—, —$OCH_2$—, —$CF_2O$—, —$OCF_2$— or —CH=CH—, and n denotes 0, 1 or 2.

7. A liquid-crystalline medium according to claim 1, wherein said medium comprises one or more compounds selected from the compounds of formulae Y-1, Y-2, Y-3 and Y-4,

Y-1

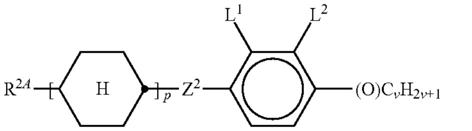

Y-2

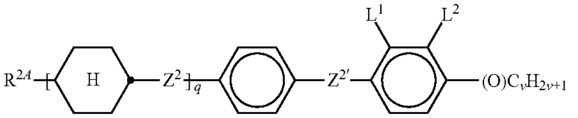

Y-3

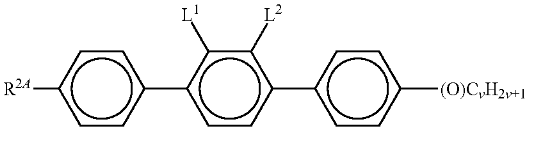

-continued

Y-4

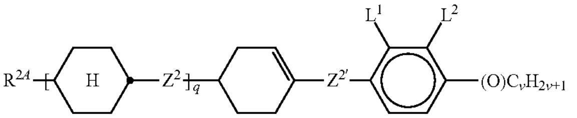

in which $R^{2A}$ denotes H, an alkyl or alkoxy radical having 1 to 15 C atoms, where, in addition, one or more $CH_2$ groups in these radicals may each be replaced, independently of one another, by —C≡C—, —$CF_2O$—, —CH=CH—,

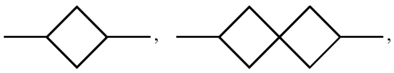

—O—, —CO—O— or —O—CO— in such a way that O atoms are not linked directly to one another, and in which, in addition, one or more H atoms may each be replaced by halogen, $L^1$ and $L^2$ each, independently of one another, denote F, Cl, $CF_3$ or $CHF_2$, $Z^2$ and $Z^{2'}$ each, independently of one another, denote a single bond, —$CH_2CH_2$—, —CH=CH—, —$CF_2O$—, —$OCF_2$—, —$CH_2O$—, —$OCH_2$—, —COO—, —OCO—, —$C_2F_4$—, —CF=CF— or —CH=CH$CH_2O$—, p denotes 0, 1 or 2, q denotes 0 or 1, $(O)C_vH_{2v+1}$ denotes $OC_vH_{2v+1}$ or $C_vH_{2v+1}$, and v denotes 1 to 6.

8. A liquid-crystalline medium according claim 1, wherein said medium comprises one or more dichroic dyes.

9. A process for the preparation of an medium according to claim 1, said process comprising mixing one or more liquid-crystalline compounds or a liquid-crystal medium with one or more compounds of the formula I.

10. A method of modulating light comprising applying a voltage to light modulation element containing a medium according to claim 1.

11. A light modulation element containing a medium according to claim 1.

12. A light modulation element according to claim 11, wherein said element is a polymer network liquid crystalline (PNLC) light modulation element operated in the reverse mode.

13. A light modulation element according to claim 11, wherein said element comprises a liquid crystal cell having two substrates and two electrodes, where at least one substrate is transparent to light and at least one substrate has one or two electrodes, and a layer, located between the substrates, of a liquid crystal medium comprising a polymerized component and a low-molecular-weight component, where the polymerized component is obtainable by polymerization of one or more polymerizable compounds between the substrates of the liquid crystal cell in the liquid crystal medium, and wherein at least one of the polymerizable compounds is a compound of formula I.

14. A process for production of a light modulation element according to claim 11, said process comprising:

cutting and cleaning of the substrates, providing electrode structures on each of the substrates, optionally coating of a dielectric layer on the electrode structure, optionally providing an alignment layer on the electrode structure, assembling the cell using an adhesive (UV or heat curable) with spacer, filling the cell with the liquid crystal medium, and exposing the liquid crystal medium to actinic radiation that induces photopolymerization of the polymerizable compounds.

15. A light modulation element according to claim 11, wherein said element is a light shutter for a transparent OLED display.

16. A liquid-crystalline medium according claim 1, wherein $R^4$ denotes alkyl having 1 to 12 C atoms or alkenyl having 2 to 9 C atoms.

17. A liquid-crystalline medium according to claim 7, wherein $L^1$ and $L^2$ denote F.

18. A liquid-crystalline medium according claim 1, wherein said medium contains >5% of the polymerizable compounds of formula I.

19. A liquid-crystalline medium according claim 1, wherein said medium contains >5% and not more than 30% of the polymerizable compounds of formula I.

20. A liquid-crystalline medium having a negative dielectric anisotropy comprising:

(a) one or more polymerizable compounds of formula I, $$P^a\text{-}(Sp^a)_{s1}\text{-}(A^1\text{-}Z^1)_{n1}\text{-}A^2\text{-}Q^1\text{-}A^3\text{-}(Z^4\text{-}A^4)_{n2}\text{-}(Sp^b)_{s2}\text{-}P^b \quad \text{I}$$

in which the individual radicals have the following meanings:

$P^a$ denotes a polymerizable group, $P^b$ denotes a polymerizable group, H or F, $Sp^a$, $Sp^b$ each, independently of one another, denote a spacer group, s1, s2 each, independently of one another, denote 0 or 1, n1, n2 each, independently of one another, denote 0 or 1, $Q^1$ denotes $-CF_2O-$, $-OCF_2-$, $-CH_2O-$, $-OCH_2$, $-(CO)O-$, $-O(CO)-$, $-(CH_2)_4-$, $-CH_2CH_2-$, $-CF_2-CF_2-$, $-CF_2-CH_2-$, $-CH_2-CF_2-$, $-CH{=}CH-$, $-CF{=}CF-$, $-CF{=}CH-$, $-(CH_2)_3O-$, $-O(CH_2)_3-$, $-CH{=}CF-$, $-C{\equiv}C-$, $-O-$, $-CH_2-$, $-(CH_2)_3-$, or $-CF_2-$, $Z^1$, $Z^4$ denote a single bond, $-CF_2O-$, $-OCF_2-$, $-CH_2O-$, $-OCH_2-$, $-(CO)O-$, $-O(CO)-$, $-(CH_2)_4-$, $-CH_2CH_2-$, $-CF_2-CF_2-$, $-CF_2-CH_2-$, $-CH_2-CF_2-$, $-CH{=}CH-$, $-CF{=}CF-$, $-CF{=}CH-$, $-(CH_2)_3O-$, $-O(CH_2)_3-$, $-CH{=}CF-$, $-C{\equiv}C-$, $-O-$, $-CH_2-$, $-(CH_2)_3-$, or $-CF_2-$, where $Z^1$ and $Q^1$ or $Z^2$ and $Q^1$ do not simultaneously denote a group selected from $-CF_2O-$ and $-OCF_2-$, $A^1$, $A^2$, $A^3$, $A^4$ each, independently of one another, denotes a radical selected from the following groups:

a) the group consisting of 1,4-phenylene and 1,3-phenylene, in which, in addition, one or two CH groups may each be replaced by N and in which, in addition, one or more H atoms may each be replaced by L, b) the group consisting of trans-1,4-cyclohexylene, 1,4-cyclohexenylene and 1,4'-bicyclohexylene, in which, in addition, one or more non-adjacent $CH_2$ groups may each be replaced by $-O-$or $-S-$ and in which, in addition, one or more H atoms may each be replaced by F or Cl, c) the group consisting of tetrahydropyran-2,5-diyl, 1,3-dioxane-2,5-diyl, tetrahydrofuran-2,5-diyl, cyclobutane-1,3-diyl, piperidine-1,4-diyl, thiophene-2,5-diyl and selenophene-2,5-diyl, each of which may, in addition, be mono- or polysubstituted by L, and d) the group consisting of saturated, partially unsaturated or fully unsaturated, and optionally substituted, polycyclic radicals having 5 to 20 cyclic C atoms, one or more of which may also be replaced by heteroatoms, L denotes on each occurrence, identically or differently, F, Cl, CN, SCN, $SF_5$ or straight-chain or branched, in each case optionally fluorinated alkyl, alkoxy, alkylcarbonyl, alkoxycarbonyl, alkylcarbonyloxy or alkoxycarbonyloxy having up to 12 C atoms; and (b) one or more compounds selected from the compounds of formulae Y-1, Y-2, Y-3 and Y-4,

Y-1

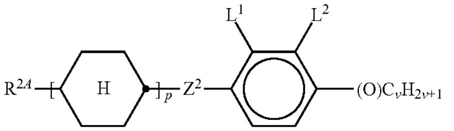

Y-2

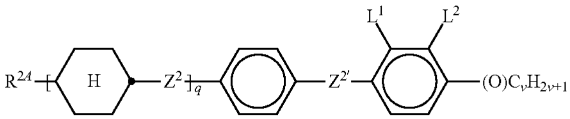

Y-3

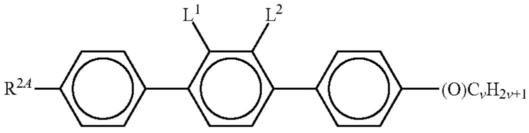

Y-4

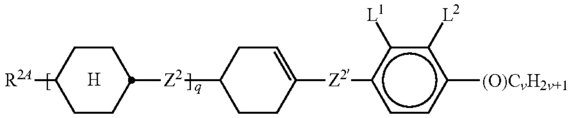

in which $R^{2A}$ denotes H, an alkyl or alkoxy radical having 1 to 15 C atoms, where, in addition, one or more $CH_2$ groups in these radicals may each be replaced, independently of one another, by $-C{\equiv}C-$, $-CF_2O-$, $-CH{=}CH-$,

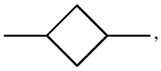, 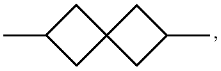, $-O-$, $-CO-O-$ or $-O-CO-$ in such a way that O atoms are not linked directly to one another, and in which, in addition, one or more H atoms may each be replaced by halogen, $L^1$ and $L^2$ each, independently of one another, denote F, Cl, $CF_3$ or $CHF_2$, $Z^2$ and $Z^{2'}$ each, independently of one another, denote a single bond, $—CH_2CH_2—$, $—CH{=}CH—$, $—CF_2O—$, $—OCF_2—$, $—CH_2O—$, $—OCH_2—$, $—COO—$, $—OCO—$, $—C_2F_4—$, $—CF{=}CF—$ or $—CH{=}CHCH_2O—$, p denotes 0, 1 or 2, q denotes 0 or 1, $(O)C_vH_{2v+1}$ denotes $OC_vH_{2v+1}$ or $C_vH_{2v+1}$, and v denotes 1 to 6.

21. A liquid-crystalline medium according claim 20, wherein said medium contains >5% of the polymerizable compounds of formula I.

22. A liquid-crystalline medium according claim 20, wherein said medium contains >5% and not more than 30% of the polymerizable compounds of formula I.

23. A liquid-crystalline medium according to claim 20, wherein said compounds of the formulae Y-1 to Y-4 are selected from the following subformulae:

Y-1a

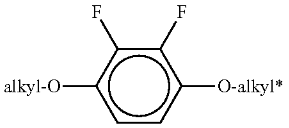

Y-1b

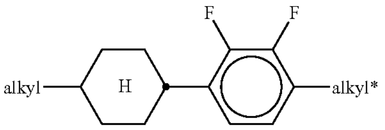

Y-1c

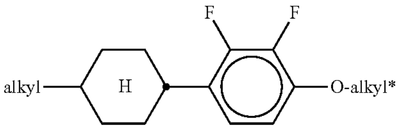

Y-1d

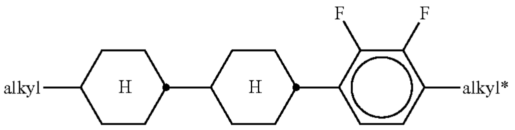

Y-1e

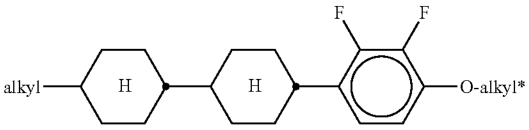

Y-1f

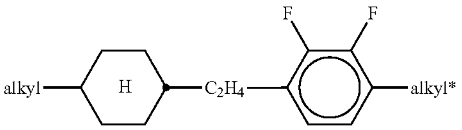

Y-1g

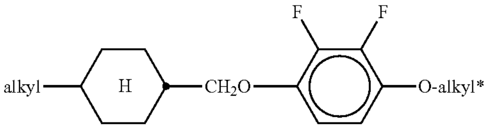

-continued

Y-1h

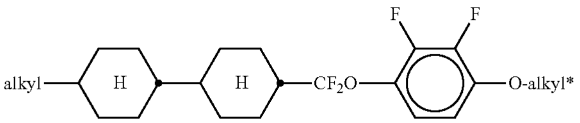

Y-1i

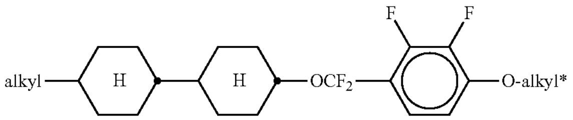

Y-1j

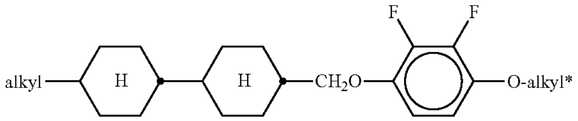

Y-1k

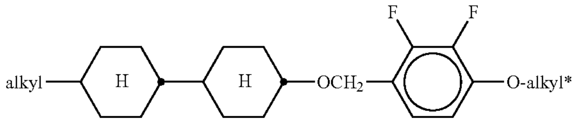

Y-1l

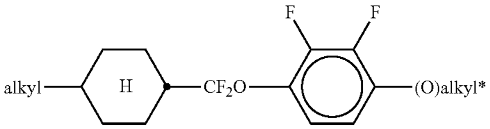

Y-1m

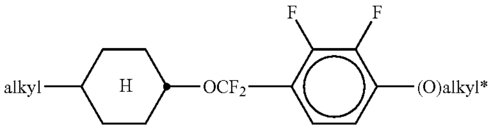

Y-1n

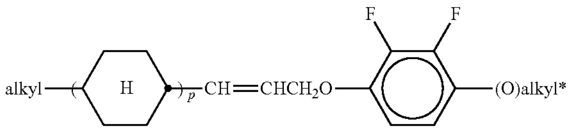

Y-1o

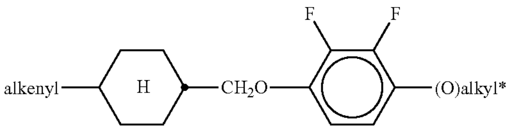

Y-1p

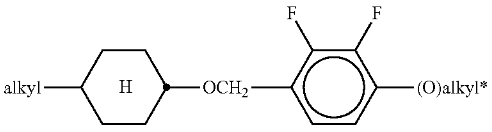

Y-1q

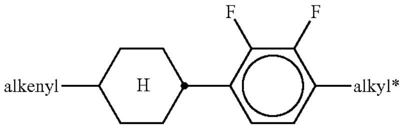

-continued

Y-1r

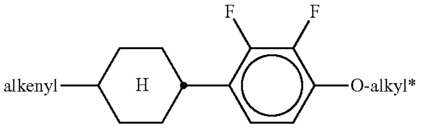

Y-1s

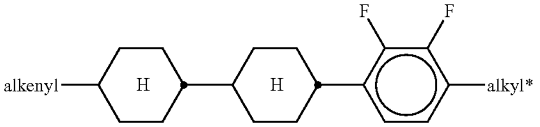

Y-1t

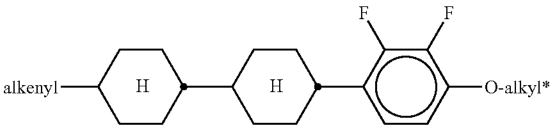

Y-1u

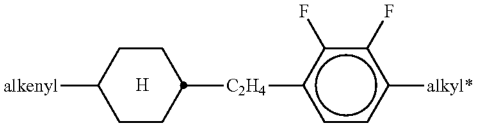

Y-1v

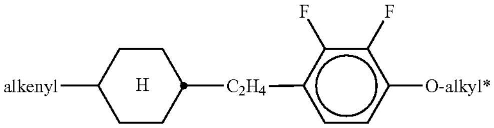

Y-2a

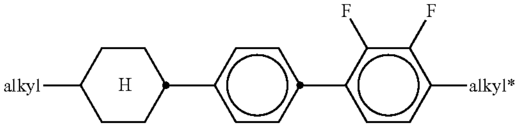

Y-2b

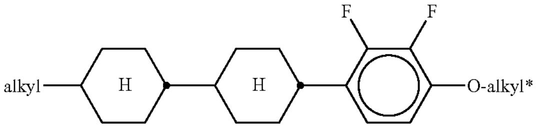

Y-2c

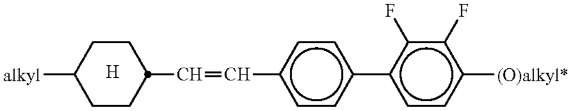

Y-2d

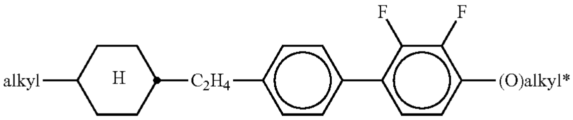

Y-2e

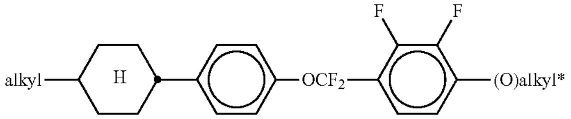

-continued

Y-2f

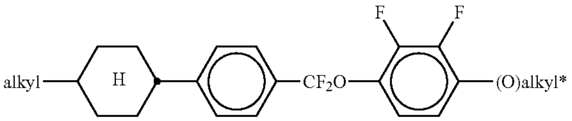

Y-2g

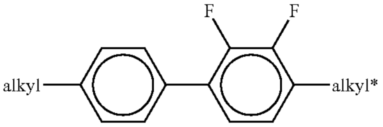

Y-2h

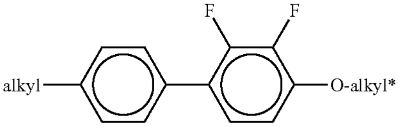

Y-2i

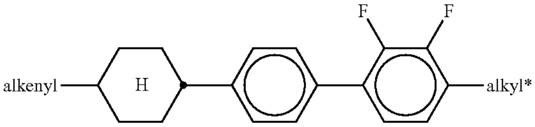

Y-2j

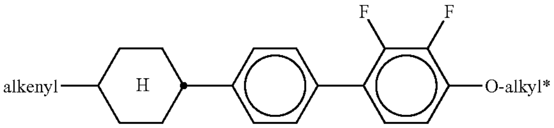

Y-3a

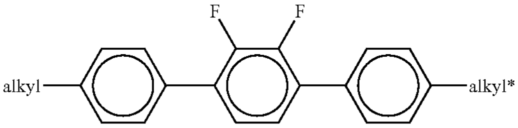

wherein alkyl and alkyl* each, independently of one another, denote a straight-chain alkyl radical having 1 to 9 C atoms, alkenyl and alkenyl* each, independently of one another, denote a straight-chain alkenyl radical having 2-6 C atoms, and (O) denotes —O— or a single bond.

24. A light modulation element containing a liquid-crystalline medium having a negative dielectric anisotropy and comprising one or more polymerizable compounds of formula I, $$P^a\text{-}(Sp^a)_{s1}\text{-}(A^1\text{-}Z^1)_{n1}\text{-}A^2\text{-}Q^1\text{-}A^3\text{-}(Z^4\text{-}A^4)_{n2}\text{-}(Sp^b)_{s2}\text{-}P^b \qquad \text{I}$$

in which the individual radicals have the following meanings:

$P^a$ denotes a polymerizable group, $P^b$ denotes a polymerizable group, H or F, $Sp^a$, $Sp^b$ each, independently of one another, denote a spacer group, s1, s2 each, independently of one another, denote 0 or 1, n1, n2 each, independently of one another, denote 0 or 1, $Q^1$ denotes —$CF_2O$—, —$OCF_2$—, —$CH_2O$—, —$OCH_2$, —(CO)O—, —O(CO)—, —$(CH_2)_4$—, —$CH_2CH_2$—, —$CF_2$—$CF_2$—, —$CF_2$—$CH_2$—, —$CH_2$—$CF_2$—, —CH═CH—, —CF═CF—, —CF═CH—, —$(CH_2)_3$ O—, —$O(CH_2)_3$—, —CH═CF—, —C≡C—, —O—, —$CH_2$—, —$(CH_2)_3$—, or —$CF_2$—, $Z^1$, $Z^4$ denote a single bond, —$CF_2O$—, —$OCF_2$—, —$CH_2O$—, —$OCH_2$—, —(CO)O—, —O(CO)—, —$(CH_2)_4$—, —$CH_2CH_2$—, —$CF_2$—$CF_2$—, —$CF_2$—$CH_2$—, —$CH_2$—$CF_2$—, —CH=CH—, —CF=CF—, —CF=CH—, —$(CH_2)_3O$—, —$O(CH_2)_3$—, —CH=CF—, —C≡C—, —O—, —$CH_2$—, —$(CH_2)_3$—, or —$CF_2$—, where $Z^1$ and $Q^1$ or $Z^2$ and $Q^1$ do not simultaneously denote a group selected from —$CF_2O$— and —$OCF_2$—, $A^1$, $A^2$, $A^3$, $A^4$ each, independently of one another, denotes a radical selected from the following groups:

a) the group consisting of 1,4-phenylene and 1,3-phenylene, in which, in addition, one or two CH groups may each be replaced by N and in which, in addition, one or more H atoms may each be replaced by L, b) the group consisting of trans-1,4-cyclohexylene, 1,4-cyclohexenylene and 1,4'-bicyclohexylene, in which, in addition, one or more non-adjacent $CH_2$ groups may each be replaced by —O—or —S— and in which, in addition, one or more H atoms may each be replaced by F or Cl, c) the group consisting of tetrahydropyran-2,5-diyl, 1,3-dioxane-2,5-diyl, tetrahydrofuran-2,5-diyl, cyclobutane-1,3-diyl, piperidine-1,4-diyl, thiophene-2,5-diyl and selenophene-2,5-diyl, each of which may, in addition, be mono- or polysubstituted by L, and d) the group consisting of saturated, partially unsaturated or fully unsaturated, and optionally substituted, polycyclic radicals having 5 to 20 cyclic C atoms, one or more of which may also be replaced by heteroatoms, and L denotes on each occurrence, identically or differently, F, Cl, CN, SCN, $SF_5$, or straight-chain or branched, in each case optionally fluorinated, alkyl, alkoxy, alkylcarbonyl, alkoxycarbonyl, alkylcarbonyloxy or alkoxycarbonyloxy having up to 12 C atoms.

* * * * *